US012666802B2

(12) United States Patent
Lee et al.

(10) Patent No.: US 12,666,802 B2
(45) Date of Patent: Jun. 23, 2026

(54) DISPLAY APPARATUS

(71) Applicant: Samsung Display Co., Ltd., Yongin-Si (KR)

(72) Inventors: Seonuk Lee, Yongin-si (KR); Jonghoon Kim, Yongin-si (KR); Juyong Kim, Yongin-si (KR); Songee Lee, Yongin-si (KR); Junhwi Lim, Yongin-si (KR); Sangyeon Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 590 days.

(21) Appl. No.: 18/102,101

(22) Filed: Jan. 27, 2023

(65) Prior Publication Data

US 2023/0240098 A1 Jul. 27, 2023

(30) Foreign Application Priority Data

Jan. 27, 2022 (KR) ........................ 10-2022-0012587

(51) Int. Cl.
H10K 59/122 (2023.01)
H10K 59/38 (2023.01)
H10K 59/88 (2023.01)

(52) U.S. Cl.
CPC ........... H10K 59/122 (2023.02); H10K 59/38 (2023.02); H10K 59/88 (2023.02)

(58) Field of Classification Search
CPC ....... H10K 59/122; H10K 59/88; H10K 59/38
USPC ........................................................ 313/501
See application file for complete search history.

(56) References Cited

U.S. PATENT DOCUMENTS

| | | | |
|---|---|---|---|
| 11,163,195 | B2 | 11/2021 | Lee et al. |
| 11,204,518 | B2 | 12/2021 | Lee et al. |
| 11,609,368 | B2 | 3/2023 | Song et al. |
| 2008/0036367 | A1 | 2/2008 | Eida et al. |
| 2019/0049786 | A1* | 2/2019 | Lazo Martinez .... G02B 5/3058 |
| 2020/0402963 | A1* | 12/2020 | Lin ........................ H10K 59/38 |
| 2021/0202587 | A1 | 7/2021 | Kim et al. |
| 2023/0099599 | A1 | 3/2023 | Lee et al. |

FOREIGN PATENT DOCUMENTS

| | | |
|---|---|---|
| CN | 110544713 A | 12/2019 |
| JP | 2006072176 A | 3/2006 |
| KR | 10-2007-0049172 A | 5/2007 |
| KR | 10-2020-0097379 A | 8/2020 |

(Continued)

OTHER PUBLICATIONS

K-PION Patent File Wrapper Search (Year: 2023).*

*Primary Examiner* — James R Greece
*Assistant Examiner* — Hana S Featherly
(74) *Attorney, Agent, or Firm* — Innovation Counsel LLP

(57) ABSTRACT

A display apparatus includes a first substrate including a display area and a non-display area around the display area, a bank disposed on the display area of the first substrate and including first openings, second openings, third openings, first dummy openings, and second dummy openings, first quantum dot layers located in the first openings, dummy layers located in the first dummy openings, and pixel electrodes located between the first substrate and the bank, wherein the first dummy openings do not overlap the pixel electrodes.

30 Claims, 18 Drawing Sheets

(56)          References Cited

FOREIGN PATENT DOCUMENTS

KR       10-2021-0000184  A        1/2021
KR             10-2223421  B1        3/2021
KR       10-2021-0086791  A        7/2021
KR       10-2021-0151302  A      12/2021
KR       10-2022-0004872  A        1/2022

* cited by examiner

DISPLAY APPARATUS

CROSS-REFERENCE TO RELATED APPLICATION

This application is based on and claims priority under 35 U.S.C. § 119 to Korean Patent Application No. 10-2022-0012587, filed on Jan. 27, 2022, in the Korean Intellectual Property Office, the disclosure of which is incorporated by reference herein in its entirety.

BACKGROUND

1. Field

One or more embodiments relate to a display apparatus, and more particularly, to a display apparatus with a low possibility of occurrence of defects in a manufacturing process.

2. Description of the Related Art

A display apparatus includes a plurality of pixels. For a full-color display apparatus, a plurality of pixels may emit light having different colors. For this purpose, at least some pixels of a display apparatus have a color-conversion portion. Accordingly, light having a first color generated from a light-emitting portion of some pixels is converted to light having a second color while passing through a corresponding color conversion portion and emitted to the outside.

SUMMARY

However, a display apparatus according to the related art has a high possibility of occurrence of defects in a manufacturing process.

In order to solve various problems including the above problem, one or more embodiments include a display apparatus with a low possibility of occurrence of defects in a manufacturing process. However, such a technical goal is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a first substrate including a display area and a non-display area around the display area, a bank disposed on the display area of the first substrate and including first openings, second openings, third openings, first dummy openings, and second dummy openings, first quantum dot layers located in the first openings, dummy layers located in the first dummy openings, and pixel electrodes located between the first substrate and the bank, wherein the first dummy openings do not overlap the pixel electrodes.

The display apparatus may further include second quantum dot layers located in the second openings.

The first quantum dot layers may convert light having a first wavelength band into light having a second wavelength band and the second quantum dot layers converts light having the first wavelength band into light having a third wavelength band.

The display apparatus may further include light-transmitting layers located in the third openings and allowing incident light to pass therethrough.

The dummy layers may include the same material as at least one of the first quantum dot layers, the second quantum dot layers, and the light-transmitting layers.

The display apparatus may further include a second substrate located above the first substrate such that the bank is disposed between the first substrate and the second substrate.

The display apparatus may further include first color filter layers located between the first quantum dot layers and the second substrate, second color filter layers located between the second quantum dot layers and the second substrate, and third color filter layers located between the light-transmitting layers and the second substrate.

One of the first color filter layers, one of the second color filter layers, and one of the third color filter layers may be located between each of the dummy layers and the second substrate.

The dummy layers may have hydrophilicity and the bank may have hydrophobicity.

An area of one of the first dummy openings may be greater than an area of one of the second dummy openings.

The second dummy openings may at least partially surround the first openings, the second openings, the third openings, and the first dummy openings.

The pixel electrode may include a first pixel electrode, a second pixel electrode, and a third pixel electrode which are spaced apart from each other on the first substrate.

The first pixel electrode may at least partially overlap one of the first openings, the second pixel electrode may at least partially overlap one of the second openings, and the third pixel electrode may at least partially overlap one of the third openings.

The first pixel electrode, the second pixel electrode, and the third pixel electrode may not overlap the first dummy openings.

The first pixel electrode, the second pixel electrode, and the third pixel electrode may not overlap the second dummy openings.

The display apparatus may further include a pixel-defining layer covering an edge of each of the first pixel electrode, the second pixel electrode, and the third pixel electrode, the pixel-defining layer having an opening exposing at least a portion of the first pixel electrode, an opening exposing at least a portion of the second pixel electrode, and an opening exposing at least a portion of the third pixel electrode, an emission layer disposed on the first pixel electrode, the second pixel electrode, and the third pixel electrode and emitting light having a first wavelength band, and an opposite electrode disposed on the emission layer.

The emission layer and the opposite electrode may overlap the first dummy openings.

The emission layer and the opposite electrode may overlap the second dummy openings.

According to one or more embodiments, a display apparatus includes a light-emitting panel including a first substrate including a display area and a non-display area around the display area, and light-emitting elements including pixel electrodes and disposed on the first substrate; and a color panel disposed on a second substrate and changing a wavelength of light emitted from the light-emitting panel, the color panel further includes: a bank disposed on the display area of the first substrate and including first openings, second openings, third openings, first dummy openings, and second dummy openings, first quantum dot layers located in the first openings, and dummy layers located in the first dummy openings, wherein the first dummy openings do not overlap the pixel electrodes.

The color panel may further include second quantum dot layers located in the second openings.

The light-emitting panel may emit light having a first wavelength band.

The first quantum dot layers may convert light having the first wavelength band into light having a second wavelength band, and the second quantum dot layers may convert light having the first wavelength band into light having a third wavelength band.

The color panel may further include a light-transmitting layers located in the third openings, wherein the light-transmitting layers may transmit incident light having the first wavelength band.

The dummy layers may include the same material as at least one of the first quantum dot layers, the second quantum dot layers, and the light-transmitting layers.

The color panel may further include first color filter layers located between the first quantum dot layers and the second substrate, second color filter layers located between the second quantum dot layers and the second substrate, and third color filter layers located between the light-transmitting layers and the second substrate.

One of the first color filter layers, one of the second color filter layers, and one of the third color filter layers may be located between each of the dummy layers and the second substrate.

The first color filter layer, the second color filter layer, and the third color filter layer may overlap the second dummy openings.

The dummy layers may have hydrophilicity and the bank may have hydrophobicity.

The second dummy openings may at least partially surround the first openings, the second openings, the third openings, and the first dummy openings.

The second dummy openings may at least partially surround the first openings, the second openings, the third openings, and the first dummy openings.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

4

Figure 8:
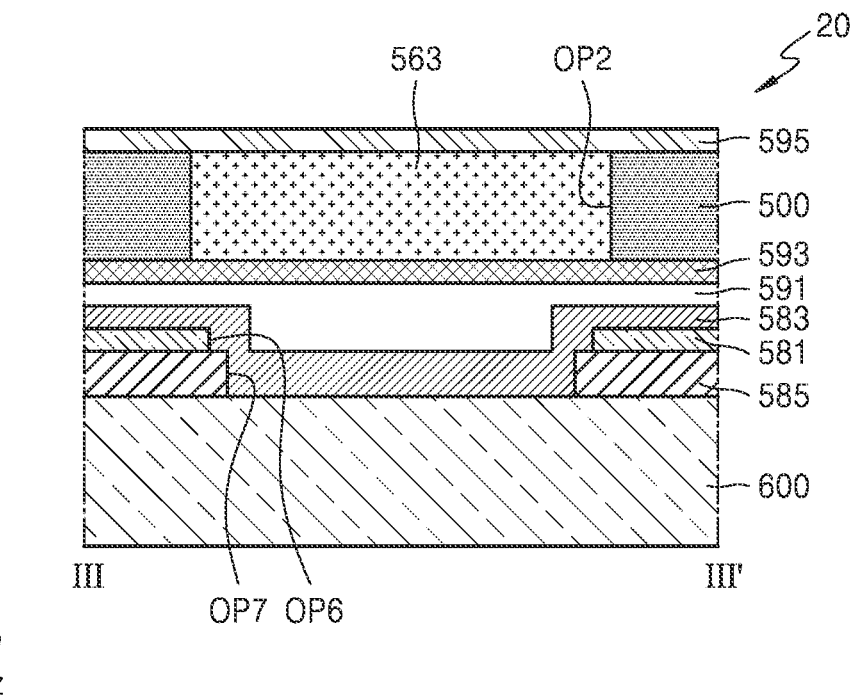
Figure 9:
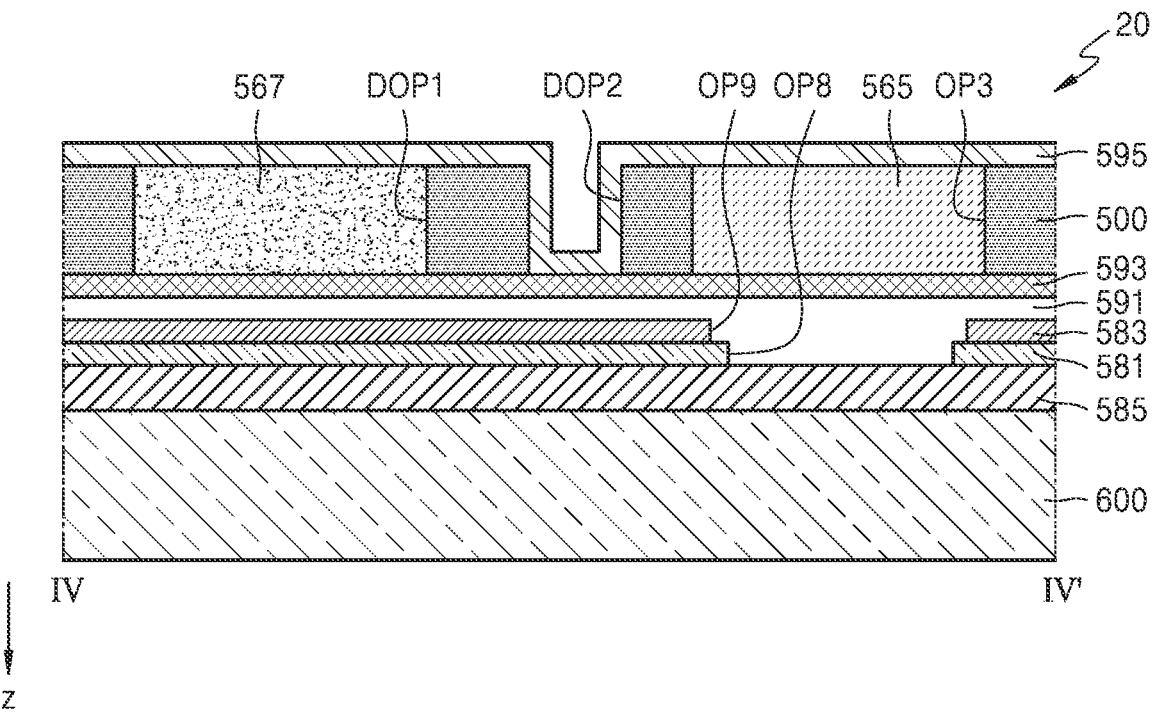
Figure 10:
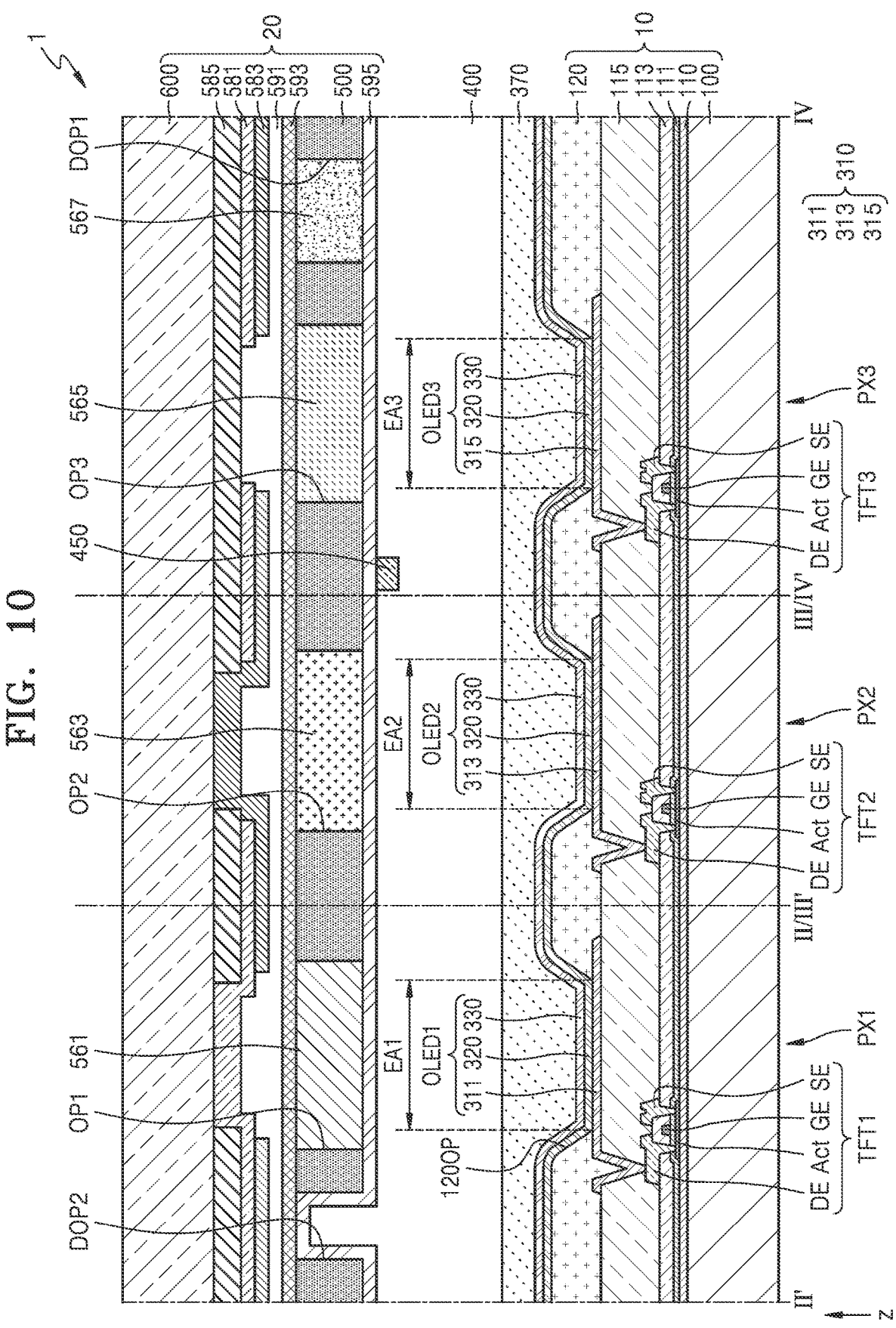

FIG. 8 is a schematic cross-sectional view illustrating a display apparatus according to an embodiment;

FIG. 9 is a schematic cross-sectional view illustrating a display apparatus according to an embodiment; and FIG. 10 is a schematic cross-sectional view illustrating a display apparatus according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The effects and features of the disclosure and the accomplishing methods thereof will become apparent from the embodiments described below in detail with reference to the accompanying drawings. The disclosure may, however, be embodied in many different forms and should not be construed as being limited to the embodiments set forth herein.

It will be understood that although the terms "first," "second," etc. may be used herein to describe various elements, these elements should not be limited by these terms. These elements are only used to distinguish one element from another.

In the following embodiments, the singular forms include the plural forms unless the context clearly indicates otherwise.

It will be further understood that the terms "comprising" and/or "including" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. In addition, because sizes and thicknesses of elements in the drawings are arbitrarily illustrated for convenience of explanation, the disclosure is not limited thereto.

In the present specification, an expression such as "A and/or B" indicates A, B, or A and B. Also, an expression such as "at least one of A and B" indicates A, B, or A and B.

In the following embodiments, the expression "a line extends in a first direction or a second direction" may include a case in which "a line extends in a linear shape" and a case in which "a line extends in a zigzag or curved shape in a first direction or a second direction."

In the following embodiments, when an element is referred to as being "on a plane," it is understood that an element is viewed from the top, and when an element is referred to as being "on a cross-section," it is understood that the element is vertically cut and viewed from the side. In the following embodiments, when elements "overlap" each other, the elements overlap "on a plane" and "a cross-section."

Hereinafter, the embodiments of the disclosure will be described in detail with reference to the accompanying drawings, and like reference numerals in the drawings denote like reference elements.

Figure 1:
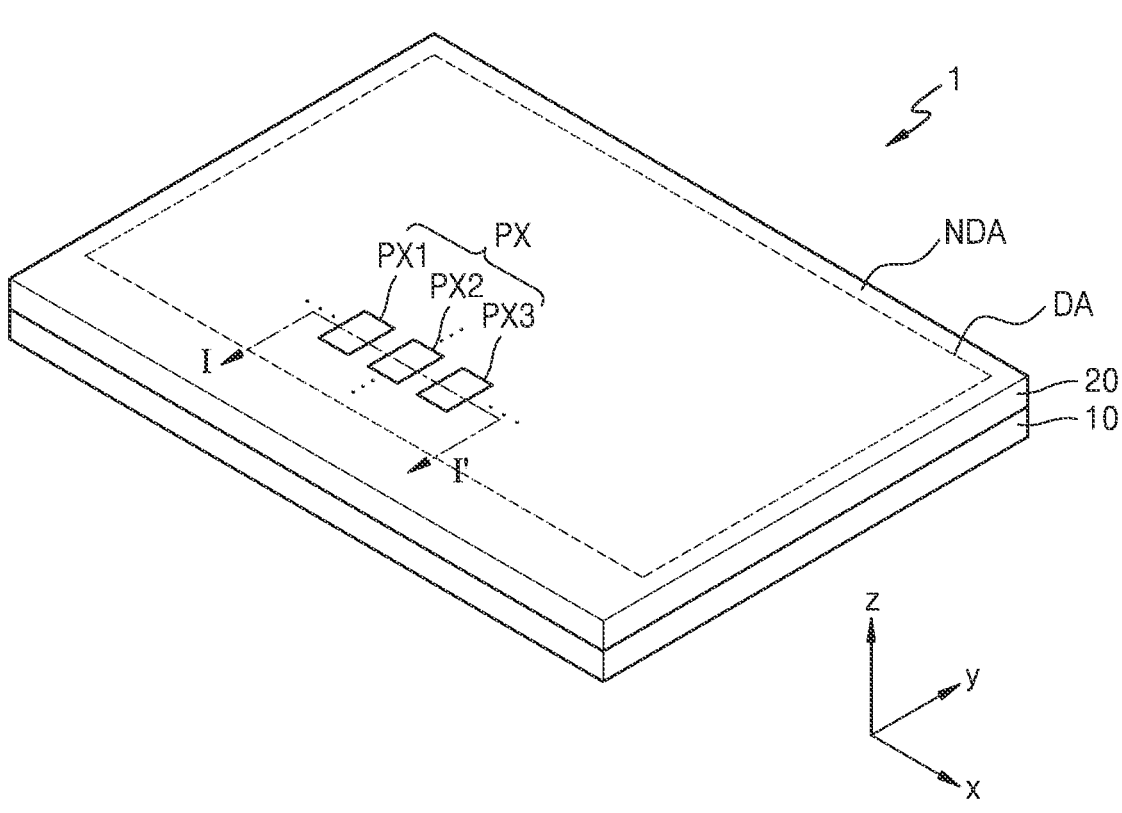
FIG. 1 is a schematic perspective view illustrating a display apparatus according to an embodiment.
Figure 2A:
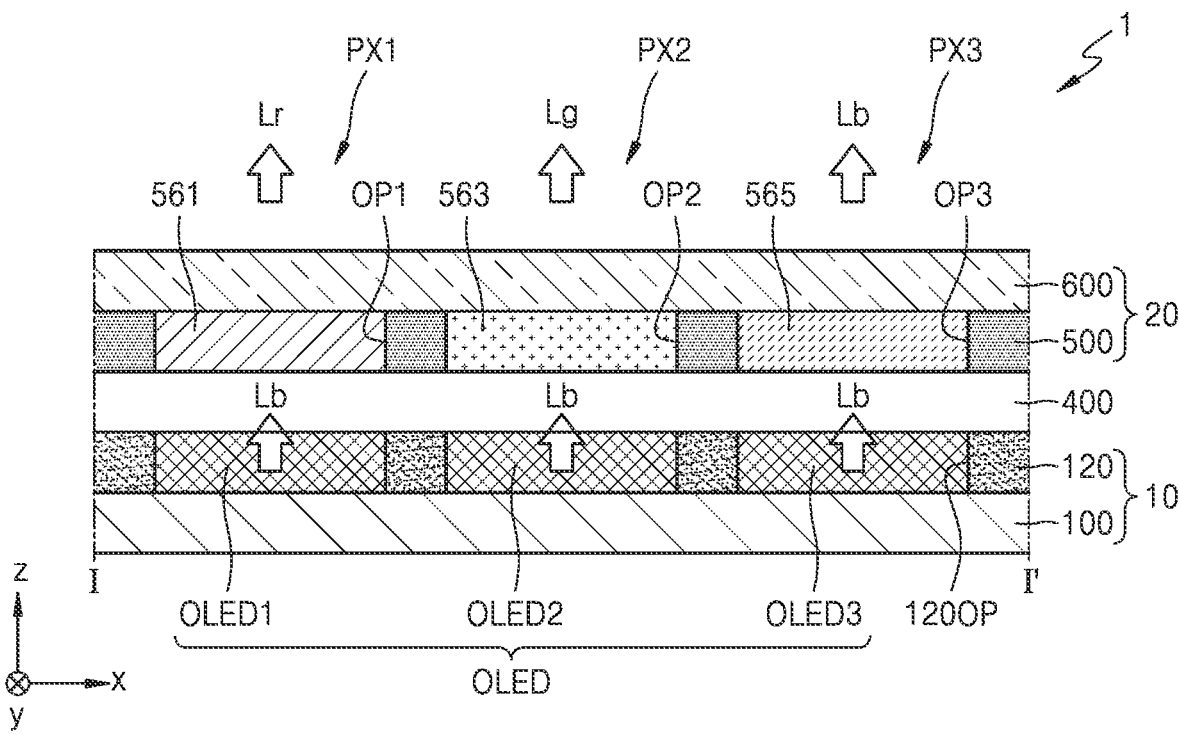
FIG. 2A is a schematic cross-sectional view illustrating a display apparatus according to an embodiment.
Figure 3:
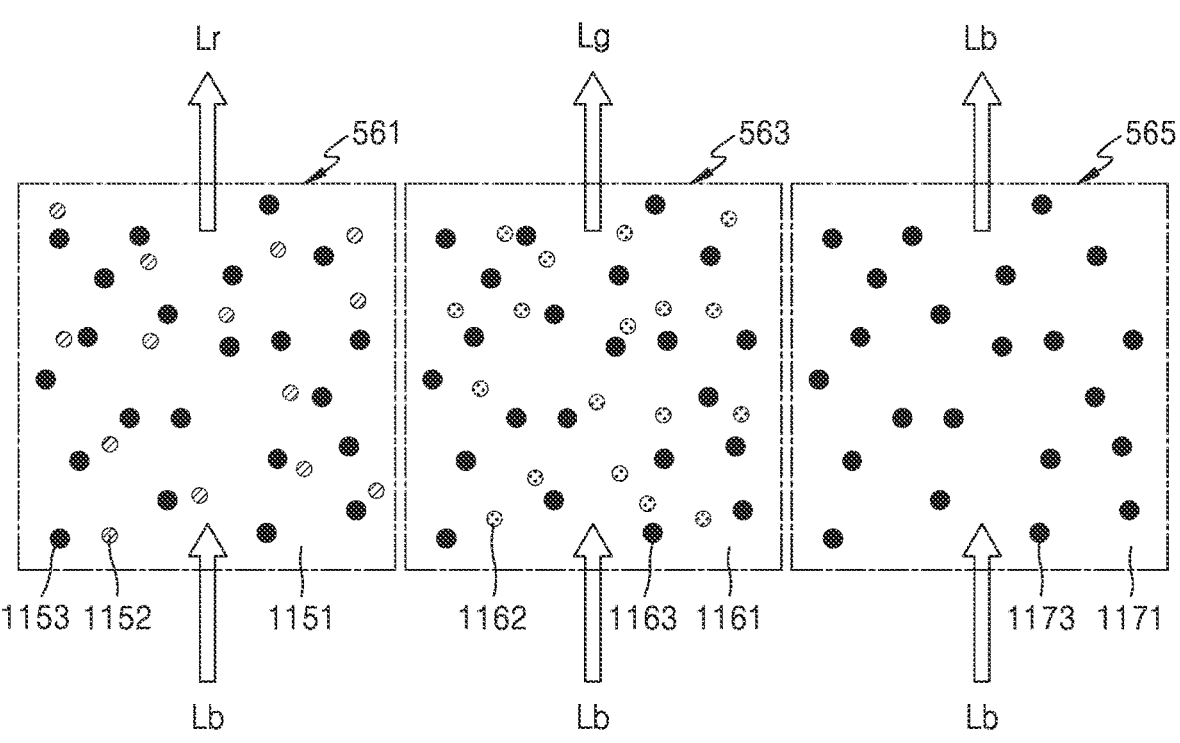
FIG. 3 is a schematic cross-sectional view illustrating portions of a first quantum dot layer, a second quantum dot layer, and a light-transmitting layer in FIG. 2A.

FIG. 1 is a schematic perspective view illustrating a display apparatus 1 according to an embodiment, FIG. 2A is a schematic cross-sectional view illustrating the display apparatus 1 according to an embodiment, and FIG. 3 is a schematic cross-sectional view illustrating portions of a first quantum dot layer, a second quantum dot layer, and a light-transmitting layer in FIG. 2A. FIG. 2A is a cross-sectional view illustrating the display apparatus 1 of FIG. 1, taken along line I-I' in FIG. 1.

Referring to FIGS. 1, 2A, and 3, the display apparatus 1 may include a display area DA and a non-display area NDA surrounding the display area DA. The display apparatus 1 may provide an image by using an array of a plurality of pixels PX that are two-dimensionally arranged in the display area DA. The plurality of pixels PX may include a first pixel PX1, a second pixel PX2, and a third pixel PX3.

Each of the pixels PX of the display apparatus 1 may include an area in which light of a color may be emitted and the display apparatus 1 may provide an image by using light emitted from the pixels PX. For example, each of the pixels PX may emit red, green, or blue light.

The non-display area NDA may include an area in which an image is not provided and may entirely surround the display area DA. A driver or a main power line for providing an electrical signal or power to pixel circuits may be arranged in the non-display area NDA. A pad to which an electronic element or a printed circuit board may be electrically connected may be included in the non-display area NDA.

The display area DA may have a polygonal shape including a quadrangular shape, as shown in FIG. 1. For example, the display area DA may have a rectangular shape of which a length is greater than a width, a rectangular shape of which a length is less than a width, or a square shape of which a length is equal to a width. Alternatively, the display area DA may have various shapes, such as an elliptical shape or a circular shape.

In an embodiment, the display apparatus 1 may include a light-emitting panel 10 and a color panel 20, which are stacked in a thickness direction (e.g., a z direction) of the display apparatus 1. Referring to FIG. 2A, the light-emitting panel 10 may include a light-emitting element OLED disposed on a first substrate 100. For example, the light-emitting element OLED may include first to third light-emitting elements OLED1, OLED2, and OLED3. In this case, the first to third light-emitting elements OLED1, OLED2, and OLED3 may be organic light-emitting diodes. However, the disclosure is not limited thereto. The first to third light-emitting elements OLED1, OLED2, and OLED3 may be inorganic light-emitting diodes, and various modifications may be made.

Light (e.g., blue light Lb) emitted by the first to third light-emitting elements OLED1, OLED2, and OLED3 may be converted into red light Lr and green light Lg, and may maintain blue light Lb while passing through the color panel 20.

In an embodiment, a pixel-defining layer 120 defining emission areas of the first to third light-emitting elements OLED1, OLED2, and OLED3 may be arranged on the first substrate 100. In other words, the pixel-defining layer 120 may include openings 120OP respectively defining the emission areas of the first to third light-emitting elements OLED1, OLED2, and OLED3.

In an embodiment, the pixel-defining layer 120 may include an organic insulating material. Alternatively, the pixel-defining layer 120 may include an inorganic insulating material, such as silicon nitride ($SiN_x$), silicon oxynitride ($SiO_xN_y$), or silicon oxide ($SiO_x$). Alternatively, the pixel-defining layer 120 may include an organic insulating material and an inorganic insulating material. In an embodiment, the pixel-defining layer 120 may include a light-blocking material and may be provided in black. The light-blocking material may include carbon black, carbon nanotubes, a resin or paste including black dye, metal particles (e.g., nickel, aluminum, molybdenum, and any alloys thereof), metal oxide particles (e.g., chromium oxide), metal nitride particles (e.g., chromium nitride), or the like. When the pixel-defining layer 120 includes a light-blocking material, external light reflection by metal layers arranged below the pixel-defining layer 120 may be reduced.

In an embodiment, a filler 400 may be arranged between the lower substrate 100 and an upper substrate 600. The filler 400 may act as a buffer against external pressure or the like. The filler 400 may include an organic material, such as methyl silicone, phenyl silicone, and polyimide. However, the disclosure is not limited thereto, and the filler 400 may include urethane-based resin, epoxy-based resin, and acryl-based resin which are organic sealants, or silicone which is an inorganic sealant.

In an embodiment, a bank 500 may be disposed on the filler 400. The bank 500 may include various materials capable of absorbing light. The bank 500 may include the same material as the pixel-defining layer 120, or may include a material different from that of the pixel-defining layer 120. For example, the bank 500 may include an opaque inorganic insulating material such as chromium oxide or molybdenum oxide, or may include an opaque organic insulating material such as black resin.

In an embodiment, the bank 500 may include openings OP1, OP2, and OP3 respectively corresponding to emission areas of the first to third light-emitting elements OLED1, OLED2, and OLED3. For example, the openings OP1, OP2, and OP3 defined in the bank 500 may be disposed in areas correspond to the openings 120OP defined in the pixel-defining layer 120, respectively. In an embodiment, a first quantum dot layer 561, a second quantum dot layer 563, and a light-transmitting layer 565 may be arranged in the openings OP1, OP2, and OP3 defined in the bank 500, respectively.

Figure 2B:
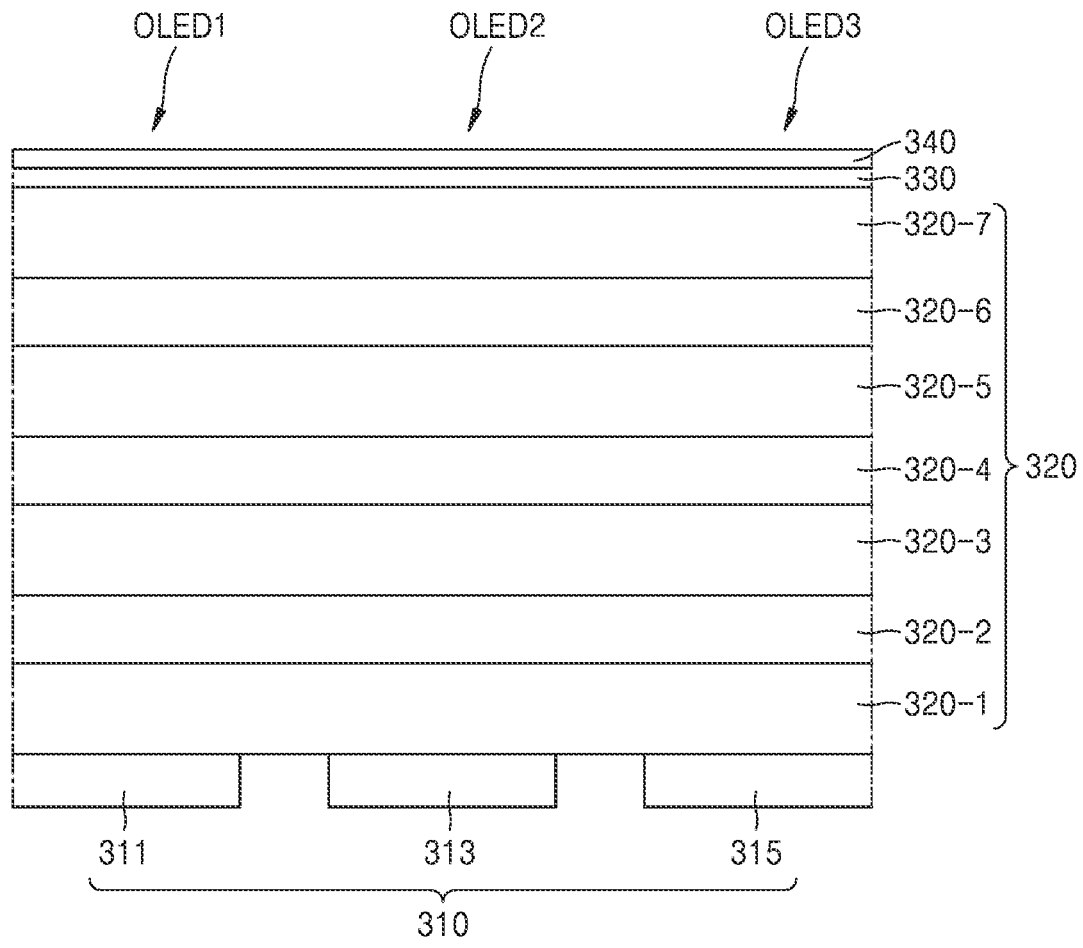
FIG. 2B is a view illustrating a stacked structure of a light-emitting element according to an embodiment.

FIG. 2B is a view illustrating a stacked structure of a light-emitting element according to an embodiment.

Referring to FIG. 2B, a first light-emitting element OLED1 may include a first pixel electrode 311, an intermediate layer 320, and an opposite electrode 330 which are sequentially stacked, and a second light-emitting element OLED2 may include a second pixel electrode 313, an intermediate layer 320, and an opposite electrode 330 which are sequentially stacked. A third light-emitting element OLED3 may include a third pixel electrode 315, an intermediate layer 320, and an opposite electrode 330 which are sequentially stacked.

In this case, the intermediate layer 320 and the opposite electrode 330 may be provided in common to the first light-emitting element OLED1 to the third light-emitting element OLED3. That is, each of the intermediate layer 320 and the opposite electrode 330 may be integrally provided as a single body. Also, a capping layer 340 may be disposed on the opposite electrode 330.

In an embodiment, the intermediate layer 320 may include light emission layers, for example, first, second, third, and fourth light emission layers 320-1, 320-3, 320-5, and 320-7, and charge generation layers, for example, first, second, and third charge generation layers 320-2, 320-4, and 320-6. Specifically, the intermediate layer 320 may include the first light emission layer 320-1, the second light emission layer 320-3, the third light emission layer 320-5, the fourth light emission layer 320-7, the first charge generation layer 320-2, the second charge generation layer 320-4, and the third charge generation layer 320-6. Each layer will be described in more detail with reference to FIGS. 2C to 2I.

FIGS. 2C to 2I are views illustrating light emission layers and charge generation layers according to an embodiment.

Figure 2C:
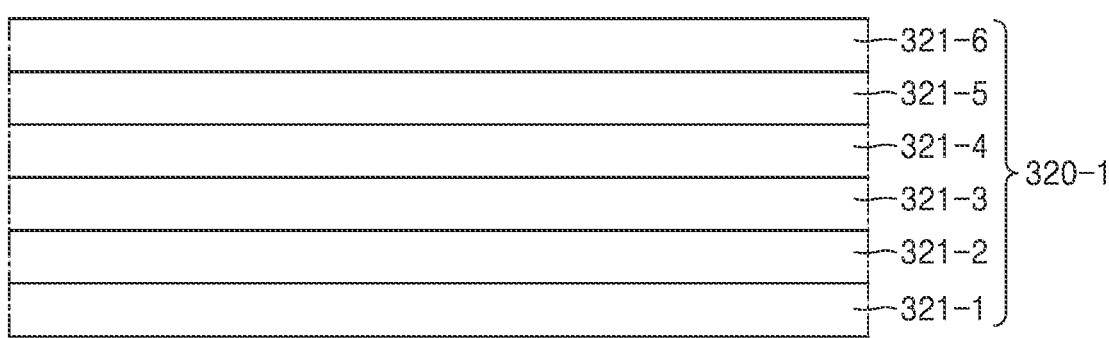
FIGS. 2C, 2D, 2E, 2F, 2G, 2H and 2I are views illustrating light emission layers and charge generation layers according to an embodiment.

Referring to FIG. 2C, a first light emission layer 320-1 may include a hole injection layer 321-1, a first hole transport layer 321-2, a first emission auxiliary layer 321-3, a first emission layer 321-4, a first buffer layer 321-5, and a first electron transport layer 321-6. However, the disclosure is not limited thereto. At least one of the first hole transport layer 321-2, the first emission auxiliary layer 321-3, the first buffer layer 321-5, and the first electron transport layer 321-6 may be omitted. For example, at least one of the first emission auxiliary layer 321-3 and the first buffer layer 321-5 may be omitted.

In this case, the first hole injection layer 321-1 may inject holes toward the first emission layer 321-4. The first hole transport layer 321-2 may transfer holes from the first hole injection layer 321-1 to the first emission layer 321-4. The first emission auxiliary layer 321-3 may be a layer added to match a resonance distance. The first electron transport layer 321-6 may transfer electrons to the first emission layer 321-4. The first buffer layer 321-5 may control (or adjust) electrons transferred from the first electron transport layer 321-6 to the first emission layer 321-4. Also, the first emission layer 321-4 may be a blue emission layer. However, the disclosure is not limited thereto. The first emission layer 321-4 may be a red emission layer or a green emission layer. The first emission layer 321-4 may include a host and a dopant. The dopant may include a phosphorescent dopant, a fluorescent dopant, or any combination thereof.

Figure 2D:
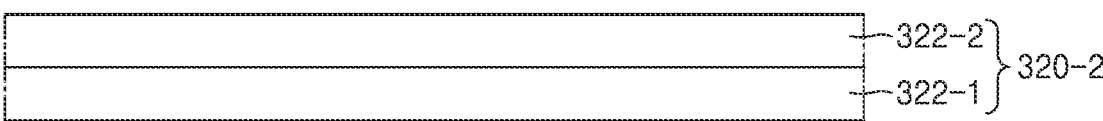

Referring to FIG. 2D, a first charge generation layer 320-2 may include a first n-type charge generation layer 322-1 and a first p-type charge generation layer 322-2. The first n-type charge generation layer 322-1 may provide electrons to the first electron transport layer 321-6 in FIG. 2C, and the first p-type charge generation layer 322-2 may provide holes to a second hole transport layer 323-1 in FIG. 2E.

Figure 2E:

Referring to FIG. 2E, a second light emission layer 320-3 may include the second hole transport layer 323-1, a second emission auxiliary layer 323-2, a second emission layer 323-3, a second buffer layer 323-4, and a second electron transport layer 323-5 which are sequentially stacked. However, the disclosure is not limited thereto. At least one of the second hole transport layer 323-1, the second emission auxiliary layer 323-2, the second buffer layer 323-4, and the second electron transport layer 323-5 may be omitted. For example, the second emission auxiliary layer 323-2 and/or the second buffer layer 323-4 may be omitted.

The second hole transport layer 323-1, the second emission auxiliary layer 323-2, the second emission layer 323-3, the second buffer layer 323-4, and the second electron transport layer 323-5 of the second light emission layer 320-3 may include the same materials as the first hole transport layer 321-2, the first emission auxiliary layer 321-3, the first emission layer 321-4, the first buffer layer 321-5, and the first electron transport layer 321-6 of the first light emission layer 320-1, respectively. However, the disclosure is not limited thereto.

Figure 2F:
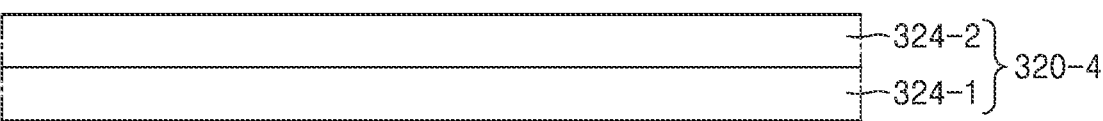

Referring to FIG. 2F, a second charge generation layer 320-4 may include a second n-type charge generation layer 324-1 and a second p-type charge generation layer 324-2. The second n-type charge generation layer 324-1 may provide electrons to the second electron transport layer 323-5 in FIG. 2E, and the second p-type charge generation layer 324-2 may provide holes to a third hole transport layer 325-1 in FIG. 2G.

Figure 2G:

Referring to FIG. 2G, a third light emission layer 320-5 may include the third hole transport layer 325-1, a third emission auxiliary layer 325-2, a third emission layer 325-3, a third buffer layer 325-4, and a third electron transport layer 325-5 which are sequentially stacked. However, the disclosure is not limited thereto. At least one of the third hole transport layer 325-1, the third emission auxiliary layer 325-2, the third buffer layer 325-4, and the third electron transport layer 325-5 may be omitted. For example, the third emission auxiliary layer 325-2 and/or the third buffer layer 325-4 may be omitted.

In an embodiment, the third emission layer 325-3 may be a green emission layer. However, the disclosure is not limited thereto. For example, the third emission layer 325-3 may be a red emission layer or a blue emission layer.

In an embodiment, when the third emission layer 325-3 is a green emission layer and the first emission layer 321-4 is a blue emission layer, the third emission layer 325-3 and the first emission layer 321-4 may include different materials. In addition, the third hole transport layer 325-1, the third emission auxiliary layer 325-2, the third buffer layer 325-4, and the third electron transport layer 325-5 of the third light emission layer 320-5 may include materials different from those of the first hole transport layer 321-2, the first emission auxiliary layer 321-3, the first buffer layer 321-5, and the first electron transport layer 321-6 of the first light emission layer 320-1, respectively.

Alternatively, when both the third emission layer 325-3 and the first emission layer 321-4 are blue emission layers, the third hole transport layer 325-1, the third emission auxiliary layer 325-2, the third buffer layer 325-4, and the third electron transport layer 325-5 of the third light emission layer 320-5 may include the same materials as the first hole transport layer 321-2, the first emission auxiliary layer 321-3, the first buffer layer 321-5, and the first electron transport layer 321-6 of the first light emission layer 320-1, respectively.

Figure 2H:
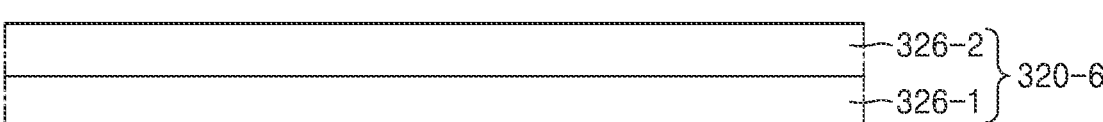

Referring to FIG. 2H, a third charge generation layer 320-6 may include a third n-type charge generation layer 326-1 and a third p-type charge generation layer 326-2. The third n-type charge generation layer 326-1 may provide electrons to the third electron transport layer 325-5 in FIG. 2G and the third p-type charge generation layer 326-2 may provide holes to a fourth hole transport layer 327-1 in FIG. 2I.

Figure 2I:
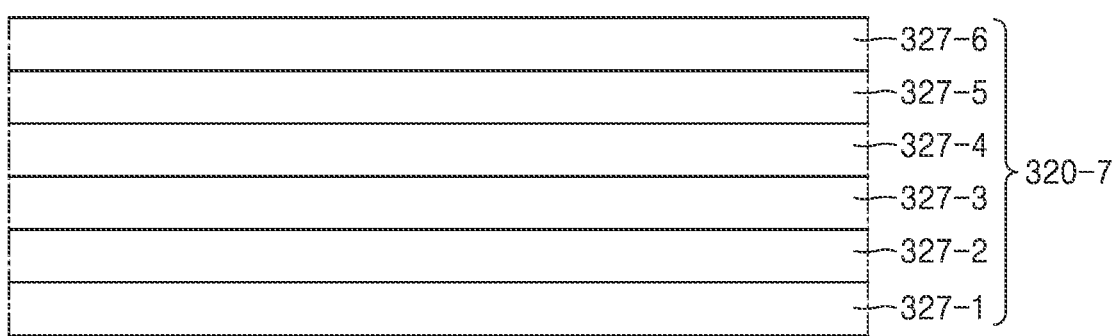

Referring to FIG. 2I, a fourth light emission layer 320-7 may include a fourth hole transport layer 327-1, a fourth emission auxiliary layer 327-2, a fourth emission layer 327-3, a fourth buffer layer 327-4, a fourth electron transport layer 327-5, and an electron injection layer 327-6 which are sequentially stacked. However, the disclosure is not limited thereto. At least one of the fourth hole transport layer 327-1, the fourth emission auxiliary layer 327-2, the fourth buffer layer 327-4, and the fourth electron transport layer 327-5 may be omitted. For example, the fourth emission auxiliary layer 327-2 and/or the fourth buffer layer 327-4 may be omitted.

The fourth hole transport layer 327-1, the fourth emission auxiliary layer 327-2, the fourth emission layer 327-3, the fourth buffer layer 327-4, and the fourth electron transport layer 327-5 of the fourth light emission layer 320-7 may include the same materials as the first hole transport layer 321-2, the first emission auxiliary layer 321-3, the first emission layer 320-4, the first buffer layer 321-5, and the first electron transport layer 321-6 of the first light emission layer 320-1, respectively. The electron injection layer 327-6 may inject electrons toward the fourth emission layer 327-3.

In an embodiment, the intermediate layer 320 in FIG. 2B may include a first emission layer 321-4 (see FIG. 2C), a second emission layer 323-3 (see FIG. 2E), a third emission layer 325-3 (see FIG. 2G), and a fourth emission layer 327-3 (see FIG. 2I). In this case, the first emission layer 321-4 (see FIG. 2C), the second emission layer 323-3 (see FIG. 2E), and the fourth emission layer 327-3 (see FIG. 2I) may each be provided as a blue emission layer, and the third emission layer 325-3 (see FIG. 2G) may be provided as a green emission layer. However, the disclosure is not limited thereto. For example, the first emission layer 321-4 (see FIG. 2C), the second emission layer 323-3 (see FIG. 2E), and the third emission layer 325-3 (see FIG. 2G) may each be provided as a blue emission layer, and the fourth emission layer 327-3 (see FIG. 2I) may be provided as a green emission layer. That is, the intermediate layer 320 may include at least one green emission layer. Because the intermediate layer 320 includes a green emission layer, the efficiency and lifetime of the intermediate layer 320 and the light-emitting elements OLED1, OLED2, and OLED3 including the intermediate layer 320 may be improved.

In an embodiment, the first quantum dot layer 561 may convert light having a first wavelength band, which passes therethrough, into light having a second wavelength band. For example, the first quantum dot layer 561 may convert light having a wavelength in a range of about 450 nm to about 495 nm, which passes therethrough, into light having a wavelength in a range of about 630 nm to about 780 nm. Accordingly, in the first pixel PX1, the light having a wavelength in a range of about 630 nm to about 780 nm may be emitted to the outside through the second substrate 600. That is, the first quantum dot layer 561 may convert incident blue light Lb into red light Lr. However, the disclosure is not limited thereto, a wavelength band of incident light to the first quantum dot layer 561 and a wavelength band of emitting light from the first quantum dot layer 561 may be modified differently.

In an embodiment, the first quantum dot layer 561 may include first quantum dots 1152, first scatterers 1153, and a first polymer 1151. The first quantum dots 1152 and the first scatterers 1153 may be dispersed in the first polymer 1151.

The first quantum dots 1152 may be excited by the blue light Lb to isotropically emit the red light Lr having a longer wavelength than the blue light Lb. The first polymer 1151 may be an organic material having light transmittance. The first scatterers 1153 may scatter the blue light Lb, which is not absorbed by the first quantum dots 1152, to excite more first quantum dots 1152, thereby increasing color conversion efficiency.

In an embodiment, the first quantum dot layer 561 may include quantum dots (e.g., the first quantum dots 1152). The quantum dots refer to crystals of a semiconductor compound and may include any material capable of emitting light having various emission wavelengths depending on the size of the crystals. The diameter of the quantum dots may be, for example, about 1 nm to about 10 nm.

The quantum dots may be synthesized by a wet chemical process, an organometallic chemical vapor deposition process, a molecular beam epitaxy process, or a similar process. The wet chemical process is a method of growing quantum dot particle crystals after mixing an organic solvent with a precursor material. In the case of the wet chemical process, when crystals grow, the organic solvent acts as a dispersant naturally coordinated on the surfaces of quantum dot crystals and controls the growth of the crystals, and thus, the wet chemical process is easier than vapor deposition, such as metal organic chemical vapor deposition (MOCVD) or molecular beam epitaxy (MBE). In addition, the wet chemical process may control the growth of quantum dot particles while being a low-cost process.

The quantum dots may include a group III-VI semiconductor compound, a group II-VI semiconductor compound, a group III-V semiconductor compound, a group III-VI semiconductor compound, a group I-III-VI semiconductor compound, a group IV-VI semiconductor compound, a group IV element or compound, or any combination thereof.

Examples of the group III-VI semiconductor compound may include a binary compound, such as $In_2S_3$, a ternary compound, such as AgInS, $AgInS_2$, CuInS, or $CuInS_2$, and any combination thereof.

Examples of the group II-VI semiconductor compound may include a binary compound, such as CdS, CdSe, CdTe, ZnS, ZnSe, ZnTe, ZnO, HgS, HgSe, HgTe, MgSe, or MgS, a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS, a quaternary compound, such as CdZnSeS, CdZnSeTe, CdZnSTe, CdHgSeS, CdHgSeTe, CdHgSTe, HgZnSeS, HgZnSeTe, or HgZnSTe, and any combination thereof.

Examples of the group III-V semiconductor compound may include a binary compound, such as GaN, GaP, GaAs, GaSb, AlN, AlP, AlAs, AlSb, InN, InP, InAs, or InSb, a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP, a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb, and any combination thereof. The group III-V semiconductor compound may further include a group II element. Examples of the group III-V semiconductor compound further including the group II element may include InZnP, InGaZnP, InAlZnP, and the like.

Examples of the group III-VI semiconductor compound may include a binary compound, such as GaS, GaSe, $Ga_2Se_3$, GaTe, InS, InSe, $In_2Se_3$, or InTe, a ternary compound, such as $InGaS_3$ or $InGaSe_3$, and any combination thereof.

Examples of the group I-III-VI semiconductor compound may include a ternary compound, such as AgInS, $AgInS_2$, CuInS, $CuInS_2$, $CuGaO_2$, $AgGaO_2$, or $AgAlO_2$, and any combination thereof.

Examples of the group IV-VI semiconductor compound may include a binary compound, such as SnS, SnSe, SnTe, PbS, PbSe, or PbTe, a ternary compound, such as SnSeS, SnSeTe, SnSTe, PbSeS, PbSeTe, PbSTe, SnPbS, SnPbSe, or SnPbTe, a quaternary compound, such as SnPbSSe, SnPbSeTe, or SnPbSTe, and any combination thereof.

Examples of the group IV element or compound may include a single element compound, such as Si or Ge, a binary compound, such as SiC or SiGe, and any combination thereof.

Each element in a multi-element compound, such as a binary compound, a ternary compound, or a quaternary compound, may be in a particle in a uniform concentration or a non-uniform concentration.

The quantum dots may each have a single structure or a core-shell double structure in which the concentration of each element in the quantum dots is uniform. For example, a material in a core and a material in a shell may be different from each other. The shell of the quantum dot may serve as a protective layer for maintaining semiconductor properties by preventing chemical transmutation of the core and/or as a charging layer for imparting electrophoretic properties to the quantum dot. The shell may be single-layered or multi-layered. An interface between the core and the shell may have a concentration gradient in which the concentration of elements in the shell decreases toward the center thereof.

Examples of the shell of the quantum dot may include a metal or non-metal oxide, a semiconductor compound, and a combination thereof. Examples of the metal or non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, a ternary compound, such as $MgAl_2O_4$, $CoFe_2O_4$, $NiFe_2O_4$, or $CoMn_2O_4$, and any combination thereof. Examples of the semiconductor compound may include a group III-VI semiconductor compound, a group II-VI semiconductor compound, a group III-V semiconductor compound, a group III-VI semiconductor compound, a group I-III-VI semiconductor compound, a group IV-VI semiconductor compound, and any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of an emission wavelength spectrum of about 45 nm or less, specifically about 40 nm or less, more specifically about 30 nm or less, and may improve color purity or color reproducibility in this range. In addition, because light emitted through the quantum dots is emitted in all directions, a wide viewing angle may be improved.

In addition, the quantum dots may be in the form of nanoparticles, nanotubes, nanowires, nanofibers, or nanoplatelet particles which have a spherical, pyramidal, multiarm or cubic shape.

Because an energy band gap may be controlled by adjusting the size of the quantum dots, light in various wavelength bands may be obtained from a quantum dot emission layer. Therefore, by using quantum dots with different sizes, a light-emitting element emitting light having different wavelengths may be implemented. Specifically, the size of the quantum dots may be selected such that red, green and/or blue light is emitted. In addition, the size of the quantum dots may be configured to emit white light by combining light of various colors.

The first quantum dot layer 561 may include scatterers (e.g., the first scatterers 1153). By allowing incident light to be scattered by the scatterers included in the first quantum dot layer 561, the incident light may be efficiently converted into light having desired wavelength by the quantum dots (e.g., the first quantum dots 1152) in the first quantum dot layer 561. The scatterers are not particularly limited as long as the scatterers includes materials capable of partially scattering transmitted light by forming an optical interface between the scatterers and a light-transmitting resin. For example, the scatterers may be metal oxide particles or organic particles. Examples of metal oxides for the scatterers may include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$), and examples of organic materials for the scatterers may include an acrylic resin and a urethane resin. The scatterers may scatter light in multiple directions regardless of the angle of incidence without substantially converting the wavelength of incident light. Accordingly, the scatterers may improve the side visibility of the display apparatus 1. In addition, the scatterers included in the first quantum dot layer 561 may increase light conversion efficiency by increasing the probability that incident light incident on the first quantum dot layer 561 meets quantum dots.

The first quantum dot layer 561 may include a first polymer 1151. In this case, the first polymer 1151 may be a resin. Any resin included in the first quantum dot layer 561 may be used as long as the resin has excellent dispersion properties with respect to the scatterers and transmits light. For example, a polymer resin, such as an acrylic resin, an imide-based resin, an epoxy-based resin, benzocyclobutene (BCB), or hexamethyldisiloxane (HMDSO), may be used as a material for forming the first quantum dot layer 415.

In an embodiment, the second quantum dot layer 563 may convert light having the first wavelength band, which passes therethrough, into light having a third wavelength band. For example, the second quantum dot layer 563 may convert light having a wavelength in a range of about 450 nm to about 495 nm, which passes therethrough, into light having a wavelength in a range of about 495 nm to about 570 nm. Accordingly, in the second pixel PX2, light Lg having a wavelength in a range of about 495 nm to about 570 nm may be emitted to the outside through the second substrate 600. That is, the second quantum dot layer 563 may convert incident blue light Lb into green light Lg.

In an embodiment, the second quantum dot layer 563 may include second quantum dots 1162, second scatterers 1163, and a second polymer 1161. The second quantum dots 1162 and the second scatterers 1163 may be dispersed in the second polymer 1161.

The second quantum dots 1162 may be excited by the blue light Lb to isotropically emit the green light Lg having a longer wavelength than the blue light Lb. The second polymer 1161 may be an organic material having light transmittance. The second scatterers 1163 may scatter the blue light Lb, which is not absorbed by the second quantum dots 1162, to excite more second quantum dots 1162, thereby increasing color conversion efficiency.

The second quantum dot layer 563 may include quantum dots (e.g., the second quantum dot 1162). The quantum dots refer to crystals of a semiconductor compound and may include any material capable of emitting light having various emission wavelengths depending on the size of the crystals. The diameter of the quantum dots may be, for example, about 1 nm to about 10 nm. The descriptions of the quantum dots included in the first quantum dot layer 561 may apply to the quantum dots included in the second quantum dot layer 563, and thus, descriptions of the quantum dots included in the second quantum dot layer 563 are omitted.

The second quantum dot layer 563 may include scatterers (e.g., the second scatterer 1163). By allowing incident light to be scattered by the scatterers included in the second quantum dot layer 563, the incident light may be efficiently converted by the quantum dots (e.g., the second quantum dots 1162) in the second quantum dot layer 563. The scatterers are not particularly limited as long as the scatterers include materials capable of partially scattering transmitted light by forming an optical interface between the scatterers and a light-transmitting resin. For example, the scatterers may be metal oxide particles or organic particles. Examples of metal oxides for the scatterers and examples of organic materials for the scatterers are the same as those described above. The scatterer may scatter light in multiple directions regardless of the angle of incidence without substantially changing the wavelength of the incident light. Accordingly, the scatterer may improve the side visibility of the display apparatus 1. In addition, the scatterers included in the second quantum dot layer 563 may increase light conversion efficiency by increasing the probability that incident light incident on the second quantum dot layer 563 meets quantum dots.

The second quantum dot layer 563 may include a second polymer 1161. In this case, the second polymer 1161 may be a resin. Any resin included in the second quantum dot layer 563 may be used as long as the resin has excellent dispersion properties with respect to the scatterers and transmits light. For example, a polymer resin, such as an acrylic resin, an imide-based resin, an epoxy-based resin, BCB, or HMDSO, may be used as a material for forming the second quantum dot layer 563.

In an embodiment, the light-transmitting layer 565 may transmit light having a wavelength belonging to the first wavelength band without wavelength conversion. For example, the light-transmitting layer 565 may transmit light having a wavelength in a range of about 450 nm to about 495 nm. Accordingly, in the third pixel PX3, light Lb having a wavelength in a range of about 450 nm to about 495 nm may be emitted to the outside through the second substrate 600. That is, the light-transmitting layer 565 may pass incident blue light Lb as the blue light Lb.

In an embodiment, the light-transmitting layer 565 may include third scatterers 1173 and a third polymer 1171. The third scatterers 1173 may be dispersed in the third polymer 1171. The third polymer 1171 may be, for example, an organic material having light transmittance, such as a silicone resin or an epoxy resin, and may be the same material as the first and second polymers 1151 and 1161 described above. The third scatterers 1173 may scatter and emit blue light Lb, and may be the same material as the first and second scatterers 1153 and 1163 described above.

In an embodiment, the first quantum dot layer 561, the second quantum dot layer 563, and the light-transmitting layer 565 may be formed in the openings OP1, OP2, and OP3 of the bank 500 through inkjet printing, respectively.

In an embodiment, the second substrate 600 may be disposed on the first quantum dot layer 561, the second quantum dot layer 563, and the light-transmitting layer 565. A first color filter layer 581 (see FIG. 7) may be disposed between the first quantum dot layer 561 and the second substrate 600, a second color filter layer 583 (see FIG. 8) may be disposed between the second quantum dot layer 563 and the second substrate 600, and a third color filter layer 585 (see FIG. 9) may be disposed between the light-transmitting layer 565 and the second substrate 600. This will be described later with reference to FIGS. 7, 8 and 9.

The first substrate 100 and the second substrate 600 may each include glass, a metal, or a polymer resin. When the first substrate 100 and the second substrate 600 are flexible or bendable, the first substrate 100 and the second substrate 600 may each include a polymer resin, such as polyethersulfone, polyacrylate, polyether imide, polyethylene naphthalate, polyethylene terephthalate, polyphenylene sulfide, polyarylate, polyimide, polycarbonate, or cellulose acetate propionate. Each of the first substrate 100 and the second substrate 600 may be variously modified. For example, each of the first substrate 100 and the second substrate 600 may have a multilayer structure including two layers including the polymer resin and a barrier layer including an inorganic material such as $SiN_x$, $SiO_xN_y$, or $SiO_x$ between the two layers.

In an embodiment, the display apparatus 1 may be formed through processes of forming the first to third light-emitting elements OLED1, OLED2, and OLED3 on the first substrate 100, forming the first and second quantum dot layers 561 and 563 and the light-transmitting layer 565 on the second substrate 600, and then bonding the first substrate 100, on which the first to third light-emitting elements OLED1, OLED2, and OLED3 are formed, to the second substrate 600 on which the first and second quantum dot layers 561 and 563 and the light-transmitting layer 565 are formed.

Figure 4:
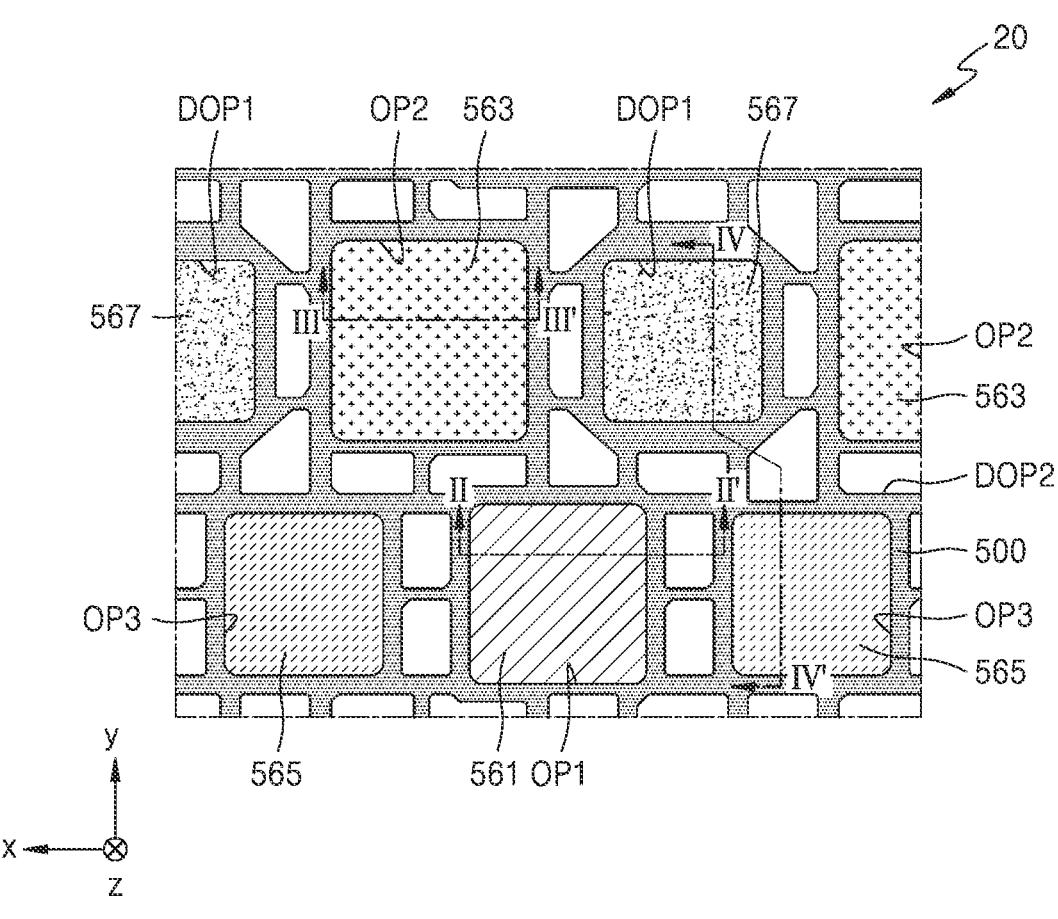
FIG. 4 is a schematic plan view illustrating a display apparatus according to an embodiment.

FIG. 4 is a schematic plan view illustrating a display apparatus according to an embodiment. Specifically, FIG. 4 is a schematic plan view illustrating a portion of the color panel 20 in FIG. 2A.

Referring to FIG. 2A and FIG. 4, the color panel 20 may include a second substrate 600 (see FIG. 2A) and a bank 500. The bank 500 may be disposed on the second substrate 600.

The bank 500 may include a plurality of openings. Specifically, in the bank 500, first openings OP1, second openings OP2, third openings OP3, first dummy openings DOP1, and second dummy openings DOP2 may be defined. The first dummy openings DOP1 and the second dummy openings DOP2, defined in the bank 500, may be located around the first openings OP1, the second openings OP2, and the third openings OP3 defined in the bank 500.

The first openings OP1, the second openings OP2, the third openings OP3, the first dummy openings DOP1, and the second dummy openings DOP2, defined in the bank 500, may be located in a display area DA (see FIG. 1). However, the disclosure is not limited thereto. For example, the first dummy openings DOP1 and the second dummy openings DOP2, defined in the bank 500, may be located in a non-display area NDA (see FIG. 1).

When viewed in a direction (e.g., a z direction) perpendicular to the first substrate 100 (see FIG. 2A), the first openings OP1, the second openings OP2, the third openings OP3, and the first dummy openings DOP1, defined in the bank 500, may each have a quadrangular shape. For example, when viewed in the direction (e.g., the z direction) perpendicular to the first substrate 100 (see FIG. 2A), the first openings OP1, the second openings OP2, the third openings OP3, and the first dummy openings DOP1, defined in the bank 500, may each have a square or rectangular shape. However, the disclosure is not limited thereto. When viewed in the direction (e.g., the z direction) perpendicular to the first substrate 100 (see FIG. 2A), the first openings OP1, the second openings OP2, the third openings OP3, and the first dummy openings DOP1, defined in the bank 500, may have various shapes, such as a circular shape, an elliptical shape, a triangular shape, and a polygonal shape.

In addition, when viewed in the direction (e.g., the z direction) perpendicular to the first substrate 100 (see FIG. 2A), the second dummy openings DOP2 defined in the bank 500 may have a polygonal shape. However, the disclosure is not limited thereto.

In an embodiment, when viewed in the direction (e.g., the z direction) perpendicular to the first substrate 100 (see FIG. 2A), an interior angle of each of the first openings OP1, the second openings OP2, the third openings OP3, the first dummy openings DOP1, and the second dummy openings DOP2 may be an obtuse angle. However, the disclosure is not limited thereto.

In an embodiment, the first quantum dot layer 561 may be located in the first openings OP1 of the bank 500. As described above, the first quantum dot layer 561 may convert light having the first wavelength band (e.g., about 450 nm to about 495 nm), which passes therethrough, into light having the second wavelength band (e.g., about 630 nm to about 780 nm).

In an embodiment, the second quantum dot layer 563 may be located in the second openings OP2 of the bank 500. As described above, the second quantum dot layer 563 may convert light having the first wavelength band (e.g., about 450 nm to about 495 nm), which passes therethrough, into light having the third wavelength band (e.g., about 495 nm to about 570 nm).

In an embodiment, the light-transmitting layer 565 may be located in the third openings OP3 of the bank 500. As described above, the light-transmitting layer 565 may pass light having the first wavelength band (e.g., about 450 nm to about 495 nm to the outside without wavelength conversion.

In an embodiment, a dummy layer 567 may be located in the first dummy openings DOP1 of the bank 500. In an embodiment, the dummy layer 567 may include the same material as the first quantum dot layer 561. For example, the dummy layer 567 may include a material for forming the first quantum dot layer 561. In this case, the material for forming the first quantum dot layer 561 may include first quantum dots 1152, first scatterers 1153, and a first polymer 1151. However, the disclosure is not limited thereto. The dummy layer 567 may include the same material as the second quantum dot layer 563. For example, the dummy layer 567 may include a material for forming the second quantum dot layer 563. In this case, the material for forming the second quantum dot layer 563 may include second quantum dots 1162, second scatterers 1163, and a second polymer 1161. Alternatively, the dummy layer 567 may include the same material as the light-transmitting layer 565. For example, the dummy layer 567 may include a material for forming the light-transmitting layer 565. In this case, the material for forming the light-transmitting layer 565 may include third scatterers 1173 and a third polymer 1171.

In an embodiment, the dummy layer 567 may include the same material as at least one of the first quantum dot layer 561, the second quantum dot layer 563, and the light-transmitting layer 565. For example, the dummy layer 567 may include at least one of a material for forming the first quantum dot layer 561, a material for forming the second quantum dot layer 563, and a material for forming the light-transmitting layer 565.

As described above, the first quantum dot layer 561, the second quantum dot layer 563, and the light-transmitting layer 565 may be formed by an inkjet printing method. In addition, the dummy layer 567 may also be formed by the inkjet printing method.

In this case, in the process of injecting the material for forming the first quantum dot layer 561 by the inkjet printing method, the material for forming the first quantum dot layer 561 may not be injected in a first opening OP1. That is, the material for forming the first quantum dot layer 561 may be injected outside of the first opening OP1. In this case, when the material for forming the first quantum dot layer 561 is injected onto the bank 500, a bonding defect may occur in the process of bonding the first substrate 100 to the second substrate 600 due to the material for forming the first quantum dot layer 561 on the bank 500.

In addition, in the process of injecting the material for forming the second quantum dot layer 563 by the inkjet printing method, the material for forming the second quantum dot layer 563 may not be injected in a second opening OP2. In this case, when the material for forming the second quantum dot layer 563 is injected onto the bank 500, a bonding defect may occur in the process of bonding the first substrate 100 to the second substrate 600 due to the material for forming the second quantum dot layer 563 on the bank 500.

Also, in the process of injecting the material for forming the light-transmitting layer 565 by the inkjet printing method, the material for forming the light-transmitting layer 565 may not be injected in a third opening OP3. In this case, due to the material for forming the light-transmitting layer 565 on the bank 500, a bonding defect may occur in the process of bonding the first substrate 100 to the second substrate 600.

To prevent or reduce the bonding defect due to the material for forming the first quantum dot layer 561, the material for forming the second quantum dot layer 563, and/or the material for forming the light-transmitting layer 565 on the bank 500, the first dummy openings DOP1 and the second dummy openings DOP2 may be defined in the bank 500 of the display apparatus according to an embodiment.

When the first dummy openings DOP1 and the second dummy openings DOP2 are defined in the bank 500, a material for forming the first quantum dot layer 561, a material for forming the second quantum dot layer 563, and/or a material for forming the light-transmitting layer 565 which is injected on the bank 500 may fill the first dummy openings DOP1 and the second dummy openings DOP2 defined in the bank 500. The first dummy openings DOP1 and the second dummy openings DOP2 in the bank 500 may reduce a thickness of the material for forming the first quantum dot layer 561, the material for forming the second quantum dot layer 563, and/or the material for forming the light-transmitting layer 565 on the bank 500, and thus, the occurrence of a bonding defect in the process of bonding the first substrate 100 to the second substrate 600 may be prevented or reduced.

However, even when the first dummy openings DOP1 and the second dummy openings DOP2 are defined in the bank 500, some of the material for forming the first quantum dot layer 561, the material for forming the second quantum dot layer 563, and/or the material for forming the light-transmitting layer 565 may still be disposed on the bank 500.

The material for forming the first quantum dot layer 561, the material for forming the second quantum dot layer 563, and/or the material for forming the light-transmitting layer 565 may have hydrophilicity, and the bank 500 may have hydrophobicity, for example, liquid repellency. Because the material for forming the first quantum dot layer 561, the material for forming the second quantum dot layer 563, and/or the material for forming the light-transmitting layer 565 have hydrophilicity, the first quantum dot layer 561, the second quantum dot layer 563, and the light-transmitting layer 565 may also have hydrophilicity.

In an embodiment, a dummy layer 567 may be disposed in the first dummy openings DOP1, and the dummy layer 567 may include at least one of the material for forming the first quantum dot layer 561, the material for forming the second quantum dot layer 563, and/or the material for forming the light-transmitting layer 565. Therefore, the dummy layer 567 may have hydrophilicity.

Because the material for forming the first quantum dot layer 561, the material for forming the second quantum dot layer 563, and/or the material for forming the light-transmitting layer 565 and the dummy layer 567 have the hydrophilicity and materials having the hydrophilicity attract each other, the dummy layer 567 located in the first dummy openings DOP1 may attract (or absorb) the material for forming the first quantum dot layer 561, the material for forming the second quantum dot layer 563, and/or the material for forming the light-transmitting layer 565 injected onto the bank 500 having the liquid repellency and reduce a thickness of a material disposed on the bank 500, and thus, the occurrence of a bonding defect in the process of bonding the first substrate 100 to the second substrate 600 may be prevented or reduced. In this case, due to a difference between the surface tension of the upper surface of the bank 500 and the surface tension of the material for forming the first quantum dot layer 561, the material for forming the second quantum dot layer 563, and/or the material for forming the light-transmitting layer 565, and the mutual attraction of the materials having the hydrophilicity, the material for forming the first quantum dot layer 561, the material for forming the second quantum dot layer 563, and/or the material for forming the light-transmitting layer 565, which are injected on the bank 500, may be move into the first dummy opening DOP1 in which the dummy layer 567 is disposed.

In an embodiment, the second dummy openings DOP2 defined in the bank 500 may at least partially surround the first openings OP1, the second openings OP2, the third openings OP3, and the first dummy openings DOP1 defined in the bank 500. For example, the number of second dummy openings DOP2 defined in the bank 500 may be greater than that of first dummy openings DOP1 defined in the bank 500. Also, the area of one of the second dummy openings DOP2 may be less than that of one of the first dummy openings DOP1. Also, the area of one of the second dummy openings DOP2 may be less than that of one of the first openings OP1.

A portion of the bank 500 may be unintentionally lost during a process of manufacturing the color panel 20. For example, the bank 500 between the first opening OP1 and the second dummy opening DOP2 may be lost, and in this case, the first quantum dot layer 561 in the first opening OP1 may flow out through the lost bank to the second dummy opening DOP2. When the amount of the first quantum dot layer 561 flowing out to the second dummy opening DOP2 is excessively large, the first quantum dot layer 561 having a sufficient thickness is not formed in the first opening OP1, which causes a corresponding pixel to be a bad pixel.

In an embodiment, the second dummy openings DOP2 may be divided into small areas and arranged to surround at least a portion of the first opening OP1, and thus, even when the bank 500 between the second dummy opening DOP2 and the first opening OP1 is lost and the first quantum dot layer 561 in the first opening OP1 flows out into the second dummy opening DOP2, the amount of the first quantum dot layer 561 flowing into the second dummy opening DOP2 may be effectively prevented or reduced.

This is also true for the other openings. The second dummy openings DOP2 may be divided into small areas and arranged to surround at least a portion of the second opening OP2, and thus, even when a portion of the bank 500 between the second opening OP2 and the second dummy opening DOP2 is lost and the second quantum dot layer 563 in the second opening OP2 flows out into the second dummy opening DOP2, the amount of the second quantum dot layer 563 flowing into the second dummy opening DOP2 may be effectively prevented or reduced.

As described above, the light-transmitting layer 565 may be located in the third opening OP3. The second dummy openings DOP2 may be divided into small areas and arranged to surround at least a portion of the third opening OP3, and thus, even when a portion of the bank 500 between the third opening OP3 and the second dummy opening DOP2 is lost and the light-transmitting layer 565 in the third opening OP3 flows out into the second dummy opening DOP2, the amount of the light-transmitting layer 565 flowing into the second dummy opening DOP2 may be effectively prevented or reduced.

Figure 5:
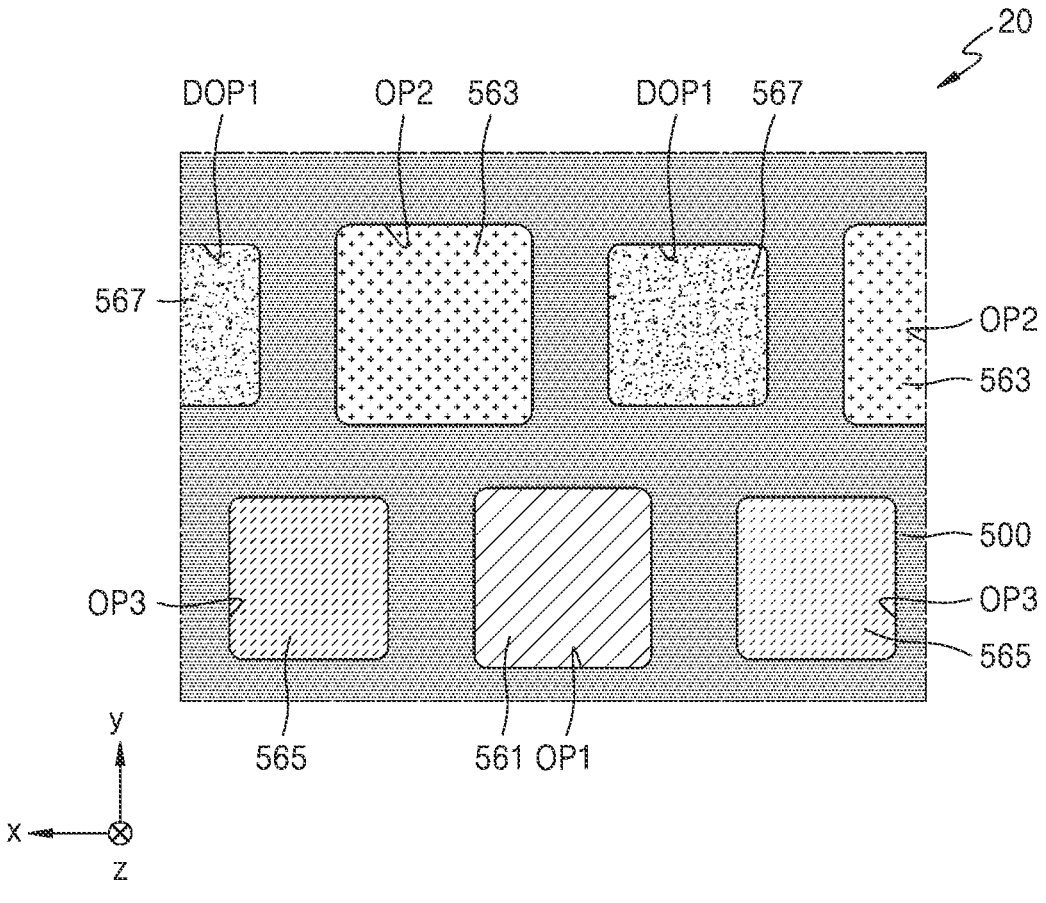
FIG. 5 is a schematic plan view illustrating a display apparatus according to an embodiment.

FIG. 5 is a schematic plan view illustrating a display apparatus according to an embodiment. Specifically, the embodiment of FIG. 5 is different from the embodiment of FIG. 4 in that the second dummy openings DOP2 are not defined in the bank 500. In FIG. 5, the same reference numerals as those of FIG. 4 refer to the same members, and repeated descriptions thereof will be omitted.

Referring to FIG. 5, a color panel 20 may include a second substrate 600 (see FIG. 2A) and a bank 500. The bank 500 may be disposed on the second substrate 600.

The bank 500 may include a plurality of openings. Specifically, first openings OP1, second openings OP2, third openings OP3, and first dummy openings DOP1 may be defined in the bank 500. That is, the second dummy openings DOP2 described above with reference to FIG. 4 may not be defined in the bank 500.

In this case, the width of the bank 500 between the first opening OP1 and the first dummy opening DOP1 may increase, and thus, a loss of the bank 500 between the first opening OP1 and the first dummy opening DOP1 may be prevented or reduced. This may be applied to other openings as well.

Figure 6:
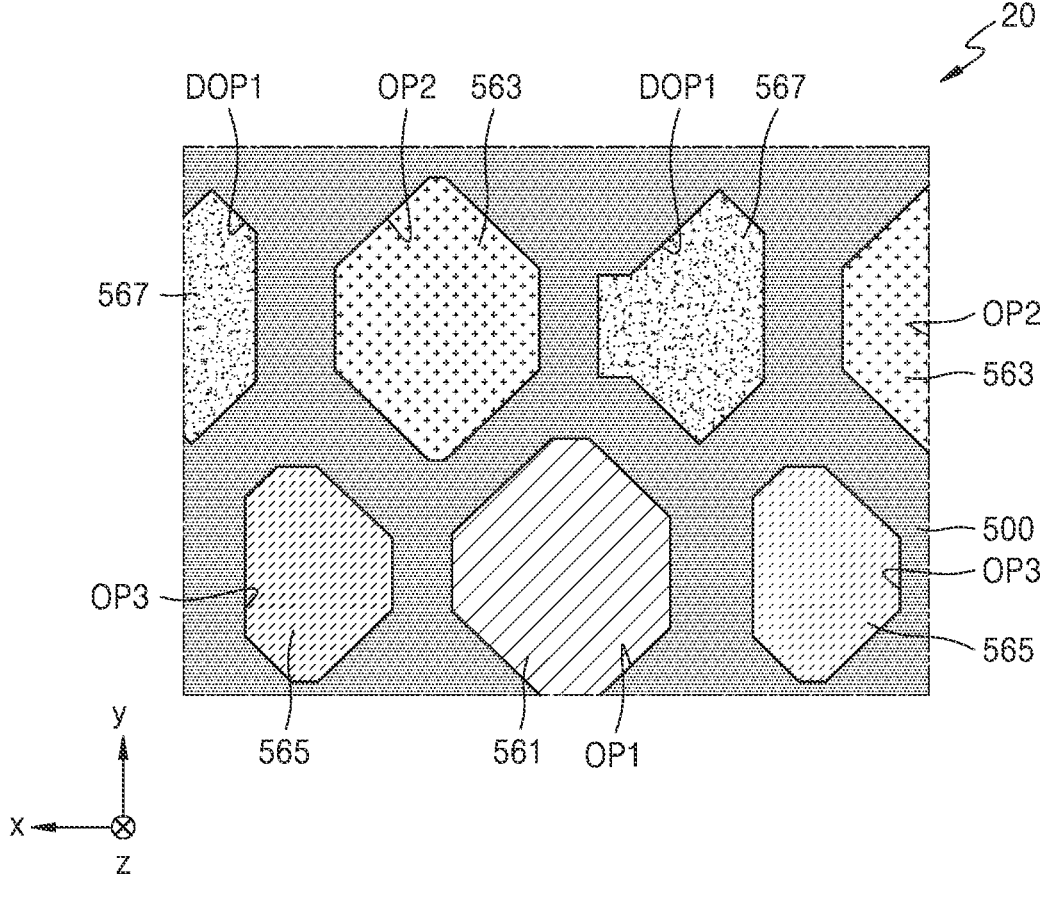
FIG. 6 is a schematic plan view illustrating a display apparatus according to an embodiment.

FIG. 6 is a schematic plan view illustrating a display apparatus according to an embodiment. Specifically, the embodiment of FIG. 6 is different from the embodiment of FIGS. 4 and 5 in that, when viewed in a direction (e.g., a z direction) perpendicular to the first substrate 100 (see FIG. 2A), first openings OP1, second openings OP2, third openings OP3, and first dummy openings DOP1, defined in a bank 500, have polygonal shapes. In FIG. 6, the same reference numerals as those of FIGS. 4 and 5 refer to the same members, and repeated descriptions thereof will be omitted.

Referring to FIG. 6, a color panel 20 may include a second substrate 600 (see FIG. 2A) and a bank 500. The bank 500 may be disposed on the second substrate 600.

The bank 500 may include a plurality of openings. In detail, the first openings OP1, the second openings OP2, the third openings OP3, and the first dummy openings DOP1 may be defined in the bank 500. That is, the second dummy openings DOP2 described above with reference to FIG. 4 may not be defined in the bank 500.

When viewed in the direction (e.g., the z direction) perpendicular to the first substrate 100 (see FIG. 2A), the first openings OP1, the second openings OP2, the third openings OP3, and the first dummy openings DOP1, defined in the bank 500, may each have a polygonal shape. For example, when viewed in the direction (e.g., the z direction) perpendicular to the first substrate 100 (see FIG. 2A), the first openings OP1, the second openings OP2, the third openings OP3, and the first dummy openings DOP1, defined in the bank 500, may have a hexagonal shape and/or an octagonal shape. However, the disclosure is not limited thereto. When viewed in the direction (e.g., the z direction) perpendicular to the first substrate 100 (see FIG. 2A), the first openings OP1, the second openings OP2, the third openings OP3, and the first dummy openings DOP1, defined in the bank 500, may have various shapes, such as a pentagonal shape and a decagonal shape.

Figure 7:
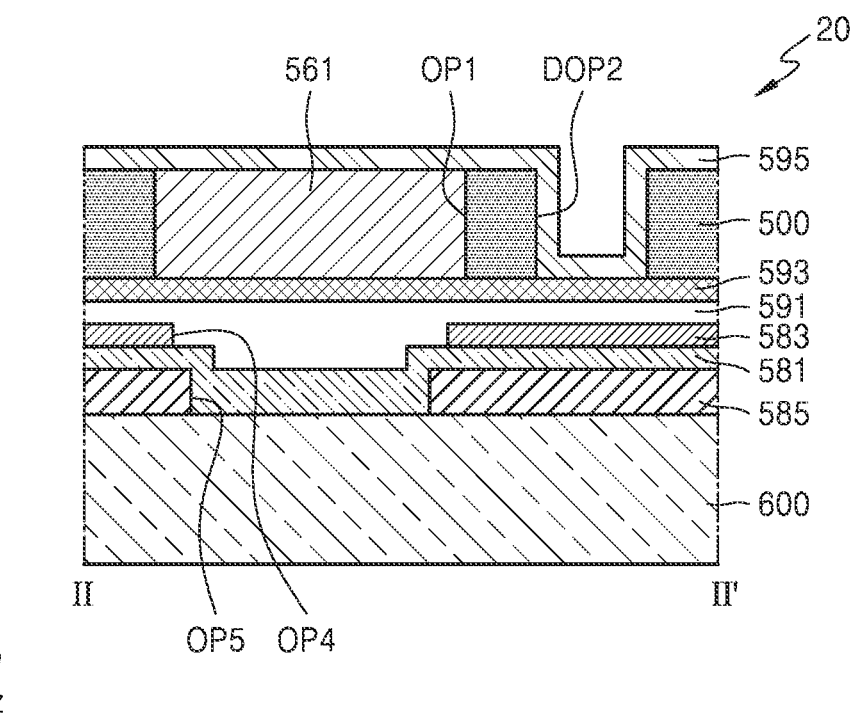
FIG. 7 is a schematic cross-sectional view illustrating a display apparatus according to an embodiment.

FIG. 7 is a schematic cross-sectional view illustrating a display apparatus according to an embodiment, FIG. 8 is a schematic cross-sectional view illustrating a display apparatus according to an embodiment, and FIG. 9 is a schematic cross-sectional view illustrating a display apparatus according to an embodiment. Specifically, FIGS. 7 to 9 are schematic cross-sectional views each illustrating a color panel 20 of a display apparatus, and are cross-sectional views respectively taken along lines II-II', III-III', and IV-IV' in FIG. 4.

Referring to FIGS. 7, 8, and 9, the display apparatus 1 of FIG. 1 may include a color panel 20, and the color panel 20 may include a second substrate 600, first to third color filter layers 581, 583, and 585, a bank 500, first and second quantum dot layers 561 and 563, a light-transmitting layer 565, and a dummy layer 567.

In an embodiment, the bank 500 may be disposed on the second substrate 600. As described above, a first opening OP1 and a second dummy opening DOP2 may be defined in the bank 500. The first quantum dot layer 561 may be disposed in the first opening OP1 defined in the bank 500.

The first color filter layer 581, the second color filter layer 583, and the third color filter layer 585 may be disposed between the bank 500 and the second substrate 600. A fourth opening OP4 may be defined in the second color filter layer 583, and a fifth opening OP5 may be defined in the third color filter layer 585. The first color filter layer 581 may be located in the fifth opening OP5 defined in the third color filter layer 585.

At least a portion of the first color filter layer 581 may be exposed through the fourth opening OP4 defined in the second color filter layer 583. Also, at least a portion of the first color filter layer 581 may be disposed in an area corresponding to the fifth opening OP5 defined in the third color filter layer 585.

The fourth opening OP4 defined in the second color filter layer 583 and the fifth opening OP5 defined in the third color filter layer 585 may at least partially overlap the first opening OP1 defined in the bank 500. As the fourth opening OP4 defined in the second color filter layer 583 and the fifth opening OP5 defined in the third color filter layer 585 at least partially overlap the first opening OP1 defined in the bank 500, light converted by the first quantum dot layer 561 may be incident on the first color filter layer 581, and light passing through the first color filter layer 581 may be emitted toward the second substrate 600.

In an embodiment, a region in which at least two of the first color filter layer 581, the second color filter layer 583, and the third color filter layer 585 overlap each other may serve as a light blocking layer. For example, because the first color filter layer 581 may transmit only light having the second wavelength band (e.g., about 630 nm to about 780 nm), the second color filter layer 583 may transmit only light having the third wavelength band (e.g., about 495 nm to about 570 nm), and the third color filter layer 585 may transmit only light having the first wavelength band (e.g., about 450 nm to about 495 nm), light may not pass through the region in which at least two of the first color filter layer 581, the second color filter layer 583, and the third color filter layer 585 overlap each other.

In an embodiment, the first color filter layer 581, the second color filter layer 583, and the third color filter layer 585 may be located between the second dummy opening DOP2 defined in the bank 500 and the second substrate 600. Accordingly, light may not be emitted to the second substrate 600 through an area overlapping the second dummy opening DOP2 defined in the bank 500.

In an embodiment, a low refractive index layer 591 and a first layer 593 may be disposed between the first quantum dot layer 561 and the first color filter layer 581. The low refractive index layer 591 may be a layer in which an organic material and an inorganic material are mixed, and may have a refractive index of about 1.2. The first layer 593 may be a layer provided to separate the low refractive index layer 591 from the first quantum dot layer 561, and may have a refractive index of about 1.4 to about 1.6. The first layer 593 may include at least one inorganic material selected from among aluminum oxide, titanium oxide, tantalum oxide, hafnium oxide, zinc oxide, silicon oxide, silicon nitride, and silicon oxynitride. The first layer 593 may have a thickness of about 4000 angstroms (Å). However, the disclosure is not limited thereto.

Although FIG. 7 illustrates an example in which the low refractive index layer 591 and the first layer 593 are disposed between the first quantum dot layer 561 and the first color filter layer 581, the disclosure is not limited thereto. At least one of the low refractive index layer 591 and the first layer 593 may be omitted.

In an embodiment, a second layer 595 may be disposed on the first quantum dot layer 561. The second layer 595 may be a layer for covering the first quantum dot layer 561 and may have a refractive index of about 1.4 to about 1.6. The second layer 595 may include at least one inorganic material selected from among aluminum oxide, titanium oxide, tantalum oxide, hafnium oxide, zinc oxide, silicon oxide, silicon nitride, and silicon oxynitride. The second layer 595 may have a thickness of about 4000 Å. However, the disclosure is not limited thereto.

Referring to FIG. 8, as described above, a second opening OP2 may be defined in the bank 500. The second quantum dot layer 563 may be disposed in the second opening OP2 defined in the bank 500.

The first color filter layer 581, the second color filter layer 583, and the third color filter layer 585 may be disposed between the bank 500 and the second substrate 600. A sixth opening OP6 may be defined in the first color filter layer 581, and a seventh opening OP7 may be defined in the third color filter layer 585. The second color filter layer 583 may be located in the sixth opening OP6 defined in the first color filter layer 581 and the seventh opening OP7 defined in the third color filter layer 585.

At least a portion of the second color filter layer 583 may be disposed in an area corresponding to the sixth opening OP6 defined in the first color filter layer 581 and the seventh opening OP7 defined in the third color filter layer 585.

The sixth opening OP6 defined in the first color filter layer 581 and the seventh opening OP7 defined in the third color filter layer 585 may at least partially overlap the second opening OP2 defined in the bank 500. As the sixth opening OP6 defined in the first color filter layer 581 and the seventh opening OP7 defined in the third color filter layer 585 at least partially overlap the second opening OP2 defined in the bank 500, light converted by the second quantum dot layer 563 may be incident on the second color filter layer 583.

In an embodiment, a low refractive index layer 591 and a first layer 593 may be disposed between the second quantum dot layer 563 and the second color filter layer 583. Also, in an embodiment, a second layer 595 may be disposed on the second quantum dot layer 563. However, at least one of the low refractive index layer 591, the first layer 593, and the second layer 595 may be omitted.

Referring to FIG. 9, as described above, a third opening OP3, a first dummy opening DOP1, and a second dummy opening DOP2 may be defined in the bank 500. A light-transmitting layer 565 may be disposed in the third opening OP3 defined in the bank 500, and a dummy layer 567 may be disposed in the first dummy opening DOP1 defined in the bank 500. As described above, the dummy layer 567 may include the same material as the light-transmitting layer 565. However, the disclosure is not limited thereto. The dummy layer 567 may include the same material as at least one of the first quantum dot layer 561, the second quantum dot layer 563, and the light-transmitting layer 565.

A first color filter layer 581, a second color filter layer 583, and a third color filter layer 585 may be disposed between the bank 500 and the second substrate 600. An eighth opening OP8 may be defined in the first color filter layer 581, and a ninth opening OP9 may be defined in the second color filter layer 583.

At least a portion of the third color filter layer 585 may be exposed through the eighth opening OP8 defined in the first color filter layer 581 and the ninth opening OP9 defined in the second color filter layer 583.

The eighth opening OP8 defined in the first color filter layer 581 and the ninth opening OP9 defined in the second color filter layer 583 may at least partially overlap the third opening OP3 defined in the bank 500. As the eighth opening OP8 defined in the first color filter layer 581 and the ninth opening OP9 defined in the second color filter layer 583 at least partially overlap the third opening OP3 defined in the bank 500, light passing through the light-transmitting layer 565 may be incident on the third color filter layer 585, and light passing through the third color filter layer 585 may be emitted toward the second substrate 600.

In an embodiment, the first color filter layer 581, the second color filter layer 583, and the third color filter layer 585 may be located between the first dummy opening DOP1 defined in the bank 500 and the second substrate 600, and between the second dummy opening DOP2 and the second substrate 600. Accordingly, light may not be emitted to the second substrate 600 through areas overlapping the first dummy opening DOP1 and/or the second dummy opening DOP2, defined in the bank 500. For example, even when the dummy layer 567 including the same material as at least one of the first quantum dot layer 561, the second quantum dot layer 563, and the light-transmitting layer 565 is disposed in the first dummy opening DOP1, light may not be emitted to the second substrate 600 through the areas overlapping the dummy layer 567 because the first color filter layer 581, the second color filter layer 583, and the third color filter layer 585 are disposed between the dummy layer 567 and the second substrate 600.

In an embodiment, a low refractive index layer 591 and a first layer 593 may be disposed between the light-transmitting layer 565 and the third color filter layer 585. Also, in an embodiment, a second layer 595 may be disposed on the light-transmitting layer 565. However, at least one of the low refractive index layer 591, the first layer 593, and the second layer 595 may be omitted.

FIG. 10 is a schematic cross-sectional view illustrating a display apparatus 1 according to an embodiment. Specifically, FIG. 10 is a cross-sectional view illustrating the display apparatus 1 in a stacking order. In FIG. 10, the same reference numerals as those of FIGS. 4 to 9 refer to the same members, and repeated descriptions thereof will be omitted.

Referring to FIG. 10, the display apparatus 1 may include a light-emitting panel 10 and a color panel 20. The light-emitting panel 10 may include a first substrate 100, a buffer layer 110, first to third insulating layers 111, 113, and 115, first to third thin-film transistors TFT1, TFT2, and TFT3, first to third light-emitting elements OLED1, OLED2, and OLED3, and a pixel-defining layer 120. The color panel 20 may include a second substrate 600, first to third color filter layers 581, 583, and 585, first and second quantum dot layers 561 and 563, a light-transmitting layer 565, a dummy layer 567, and a bank 500.

A buffer layer 110 may be disposed on the first substrate 100. As described above, the first substrate 100 may include glass, a metal, or a polymer resin. The buffer layer 110 may include an inorganic material, such as silicon oxide, silicon nitride, and/or silicon oxynitride. The buffer layer 110 may be disposed on the first substrate 100 and increase the smoothness of the upper surface of the first substrate 100 or prevent or reduce penetration of impurities from a lower portion of the first substrate 100 to the first to third thin film transistors TFT1, TFT2, and TFT3.

In an embodiment, the first light-emitting element OLED1 including a first pixel electrode 311, the second light-emitting element OLED2 including a second pixel electrode 313, and the third light-emitting element OLED3 including a third pixel electrodes 315 may be disposed on the first substrate 100. In addition, the first thin-film transistor TFT1, the second thin-film transistor TFT2, and the third thin-film transistor TFT3 may be disposed on the first substrate 100.

The first thin-film transistor TFT1 may be electrically connected to the first light-emitting element OLED1, the second thin-film transistor TFT2 may be electrically connected to the second light-emitting element OLED2, and the third thin-film transistor TFT3 may be electrically connected to the third light-emitting element OLED3.

Hereinafter, the first thin-film transistor TFT1 and the first light-emitting element OLED1 will be mainly described. The second thin-film transistor TFT2 and the third thin-film transistor TFT3 may be similar to the first thin-film transistor TFT1, and the second light-emitting element OLED2 and the third light-emitting element OLED3 may be similar to the first light-emitting element OLED1.

The first to third thin-film transistors TFT1, TFT2, and TFT3 may be disposed on the buffer layer 110. The first thin-film transistor TFT1 may include a semiconductor layer Act, a gate electrode GE, a source electrode SE, and a drain electrode DE.

The semiconductor layer Act may include polysilicon. Alternatively, the semiconductor layer Act may include amorphous silicon, an oxide semiconductor, or an organic semiconductor. The semiconductor layer Act may include a channel region, and a drain region and a source region respectively disposed on both sides of the channel region.

The first insulating layer 111 may be disposed on the semiconductor layer Act. The first insulating layer 111 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In this case, $ZnO_x$ may include zinc oxide (ZnO) and/or zinc peroxide ($ZnO_2$).

The gate electrode GE may be disposed on the first insulating layer 111. The gate electrode GE may overlap the channel region. The gate electrode GE may include a low-resistance metal material. The gate electrode GE may include a conductive material including molybdenum (Mo), aluminum (Al), copper (Cu), titanium (Ti), or the like, and may include a multi-layer or single layer including the conductive material.

The second insulating layer 113 may be disposed on the gate electrode GE. The second insulating layer 113 may include at least one of $SiO_2$, $SiN_X$, SiON, $Al_2O_3$, $TiO_2$, $Ta_2O_5$, $HfO_2$, and $ZnO_X$. In this case, $ZnO_X$ may include ZnO and/or $ZnO_2$.

The source electrode SE and the drain electrode DE may be disposed on the second insulating layer 113. The source electrode SE and the drain electrode DE may each include a material having good conductivity. The source electrode SE and the drain electrode DE may each include a conductive material including Mo, Al, Cu, Ti, or the like, and may include a multi-layer or single layer including the conductive material. For example, the source electrode SE and the drain electrode DE may each have a multilayer structure of Ti/Al/Ti.

The third insulating layer 115 may be disposed on the source electrode SE and the drain electrode DE. The third insulating layer 115 may include an organic insulating material. For example, the third insulating layer 115 may include an organic insulating material, such as a general purpose polymer such as polymethylmethacrylate (PMMA) or polystyrene (PS), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The first light-emitting element OLED1, the second light-emitting element OLED2, and the third light-emitting element OLED3 may be located on the third insulating layer 115 of the first substrate 100. In FIG. 10, the first to third light-emitting elements OLED1, OLED2, and OLED3, which are organic light-emitting elements, are illustrated as being located on the third insulating layer 115. The first light-emitting element OLED1 may be located in the first pixel PX1, the second light-emitting element OLED2 may be located in the second pixel PX2, and the third light-emitting element OLED3 may be located in the pixel PX3.

The first light-emitting element OLED1 may include a first pixel electrode 311, an opposite electrode 330, and an intermediate layer 320 disposed between the first pixel electrode 311 and the opposite electrode 330. The second light-emitting element OLED2 may include a second pixel electrode 313, an opposite electrode 330, and an intermediate layer 320 disposed between the second pixel electrode 313 and the opposite electrode 330. In addition, the third light-emitting element OLED3 may include a third pixel electrode 315, an opposite electrode 330, and an intermediate layer 320 disposed between the third pixel electrode 315 and the opposite electrode 330. In this case, the intermediate layer 320 may include a plurality of emission layers.

The pixel-defining layer 120 may be disposed on the third insulating layer 115. The pixel-defining layer 120 may have an opening 120OP corresponding to each pixel, that is, an opening 120OP through which at least a portion of the first pixel electrode 311 is exposed, and thus may define a pixel. For example, the first light-emitting element OLED1 may have a first emission area EA1, and the first emission area EA1 of the first light-emitting element OLED1 may be defined by the opening 120OP of the pixel-defining layer 120. In this case, the first emission area EA1 may correspond to an emission area of the first light-emitting element OLED1.

The pixel-defining layer 120 may have an opening 120OP through which at least a portion of the second pixel electrode 313 is exposed, and thus may define a pixel. For example, the second light-emitting element OLED2 may have a second emission area EA2, and the second emission area EA2 of the second light-emitting element OLED2 may be defined by the opening 120OP of the pixel-defining layer 120. In this case, the second emission area EA2 may correspond to an emission area of the second light-emitting element OLED2.

The pixel-defining layer 120 may have an opening 120OP through which at least a portion of the third pixel electrode 315 is exposed, and thus may define a pixel. For example, the third light-emitting element OLED3 may have a third emission area EA3, and the third emission area EA3 of the third light-emitting element OLED3 may be defined by the opening 120OP of the pixel-defining layer 120. In this case, the third emission area EA3 may correspond to an emission area of the third light-emitting element OLED3.

In addition, the pixel-defining layer 120 may increase the distance between an edge of the first pixel electrode 311 and the opposite electrode 330, the distance between an edge of the second pixel electrode 313 and the opposite electrode 330, and the distance between an edge of the third pixel electrode 315 and the opposite electrode 330, thereby preventing the occurrence of arcs in the edges of the first to third pixel electrodes 311 to 315.

The first pixel electrode 311 may be electrically connected to the first thin-film transistor TFT1 through a contact hole defined in the third insulating layer 115 and the like, the second pixel electrode 313 may be electrically connected to the second thin-film transistor TFT2 through a contact hole defined in the third insulating layer 115 and the like, and the third pixel electrode 315 may be electrically connected to the third thin-film transistor TFT3 through a contact hole defined in the third insulating layer 115 and the like.

The first pixel electrode 311 may include a light-transmitting conductive layer including a light-transmitting conductive oxide such as ITO, $In_2O_3$, or IZO, and a reflective layer including a metal such as Al or Ag. For example, the first pixel electrode 311 may have a three-layer structure of ITO/Ag/ITO. The second pixel electrode 313 and the third pixel electrode 315 may include the same material as the first pixel electrode 311.

The intermediate layer 320 may be disposed on the first pixel electrode 311, the second pixel electrode 313, and the third pixel electrode 315. As shown in FIG. 10, the intermediate layer 320 may be integrally formed as a single body over the first pixel electrode 311, the second pixel electrode 313, and the third pixel electrode 315. However, the disclosure is not limited thereto. The intermediate layer 320 may be patterned to correspond to each of the first to third pixel electrodes 311, 313, and 315. The intermediate layer 320 may have the structure described above with reference to FIGS. 2B to 2I. For example, each of the emission layers 321-4, 323-3, 325-3, and 327-3 (see FIGS. 2B to 2I) of the intermediate layer 320 may be integrally formed as a single body over the first pixel electrode 311, the second pixel electrode 313, and the third pixel electrode 315. However, the disclosure is not limited thereto. The emission layers 321-4, 323-3, 325-3, and 327-3 of the intermediate layer 320 may be patterned to correspond to each of the first to third pixel electrodes 311, 313, and 315.

The opposite electrode 330 may be disposed on the intermediate layer 320. The opposite electrode 330 may also be integrally formed as a single body over the first pixel electrode 311, the second pixel electrode 313, and the third pixel electrode 315. The opposite electrode 330 may include a conductive material having a low work function. For example, the opposite electrode 330 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or an alloy thereof. For example, the opposite electrode 330 may include AgMg or AgYb. Alternatively, the opposite electrode 330 may further include a layer including ITO, IZO, ZnO, or $In_2O_3$ on the (semi) transparent layer including the aforementioned material.

The intermediate layer 320 may emit light having the first wavelength band (e.g., about 450 nm to about 495 nm). For example, light having the first wavelength band (e.g., about 450 nm to about 495 nm) may be emitted from the emission layers 321-4, 323-3, 325-3, and 327-3 of the intermediate layer 320. However, the disclosure is not limited thereto. Light having the third wavelength band (e.g., about 495 nm to about 570 nm) may be emitted from one of the emission layers 321-4, 323-3, 325-3, and 327-3 of the intermediate layer 320, and light having the first wavelength band (e.g., about 450 nm to about 495 nm) may be emitted from the rest. However, even in this case, light having the first wavelength band (e.g., about 450 nm to about 495 nm) may be emitted from the intermediate layer 320. Accordingly, light having the first wavelength band (e.g., about 450 nm to about 495 nm) may be emitted from the first light-emitting element OLED1, the second light-emitting element OLED2, and the third light-emitting element OLED3. However, the disclosure is not limited thereto.

The pixel electrode 310 may be patterned to correspond to each pixel, and each of the intermediate layer 320 and the opposite electrode 330 may be integrally provided as a single body over each pixel.

Because the organic light-emitting elements may be easily damaged by external moisture or oxygen, an encapsulation layer 370 may cover the organic light-emitting elements to protect them, if necessary. The encapsulation layer 370 may be provided as a thin-film encapsulation layer including at least one inorganic layer and at least one organic layer. In this case, the thin-film encapsulation layer may include a first inorganic layer, an organic layer, and a second inorganic layer which are sequentially stacked.

The first inorganic layer may be directly disposed on the opposite electrode 330. The first inorganic layer may prevent or reduce penetration of external moisture or oxygen into the first to third light-emitting elements OLED1 to OLED3.

The organic layer may be directly disposed on the first inorganic layer. The organic layer may provide a flat surface on the first inorganic layer. Steps or particles formed on the upper surface of the first inorganic layer may be covered by the organic layer in order to block the influence of the surface state of the upper surface of the first inorganic layer on components formed on the organic layer.

The second inorganic layer may be directly disposed on the organic layer. The second inorganic layer may prevent or reduce the release of moisture emitted from the organic layer to the outside. In an embodiment, the second inorganic layer may have a refractive index of about 1.6.

The first inorganic layer and the second inorganic layer may each include at least one inorganic material selected from among aluminum oxide, titanium oxide, tantalum oxide, hafnium oxide, zinc oxide, silicon oxide, silicon nitride, and silicon oxynitride. The first inorganic layer and the second inorganic layer may each include a single layer or multi-layer including the aforementioned material. The organic layer may include a polymer-based material. The polymer-based material may include an acrylic resin, an epoxy-based resin, polyimide, polyethylene, or the like. In an embodiment, the organic layer may include an acrylate.

A bank 500 may be disposed on the first light-emitting element OLED1, the second light-emitting element OLED2, and the third light-emitting element OLED3. The bank 500 may include various materials capable of absorbing light. The bank 500 may include the same material as the pixel-defining layer 120. However, the disclosure is not limited thereto. For example, the bank 500 may include a material different from that of the pixel-defining layer 120. For example, the bank 500 may include an opaque inorganic insulating material such as chromium oxide or molybdenum oxide, or an opaque organic insulating material such as black resin.

As described above, in the bank 500, a first opening OP1, a second opening OP2, a third opening OP3, a first dummy opening DOP1, and a second dummy opening DOP2 may be defined. The first opening OP1 defined in the bank 500 may be disposed in an area correspond to the first emission area EA1 of the first light-emitting element OLED1, the second opening OP2 defined in the bank 500 may be disposed in an area correspond to the second emission area EA2 of the second light-emitting element OLED2, and the third opening OP3 defined in the bank 500 may be disposed in an area correspond to the third emission area EA3 of the third light-emitting element OLED3. That is, the first opening OP1, the second opening OP2, and the third opening OP3, defined in the bank 500, may be disposed in areas correspond to the openings 120OP defined in the pixel-defining layer 120.

In an embodiment, the area of the first opening OP1 defined in the bank 500 may be greater than the area of the opening 120OP of the pixel-defining layer 120 defining the first emission area EA1. However, the disclosure is not limited thereto. The area of the first opening OP1 defined in the bank 500 may be equal to or less than the area of the opening 120OP of the pixel-defining layer 120 defining the first emission area EA1.

In an embodiment, a first quantum dot layer 561 may be disposed in the first opening OP1 defined in the bank 500, a second quantum dot layer 563 may be disposed in the second opening OP2 defined in the bank 500, and a light-transmitting layer 565 may be disposed in the third opening OP3 defined in the bank 500. Also, a dummy layer 567 may be disposed in the first dummy opening DOP1 defined in the bank 500.

Because the first quantum dot layer 561 is disposed in the first opening OP1 defined in the bank 500, the first quantum dot layer 561 may at least partially overlap the first pixel electrode 311 of the first light-emitting element OLED1. Because the second quantum dot layer 563 is disposed in the second opening OP2 defined in the bank 500, the second quantum dot layer 563 may at least partially overlap the second pixel electrode 313 of the second light-emitting element OLED2. In addition, because the light-transmitting layer 565 is disposed in the third opening OP3 defined in the bank 500, the light-transmitting layer 565 may at least partially overlap the third pixel electrode 315 of the third light-emitting element OLED3.

However, the first dummy opening DOP1 defined in the bank 500 may not overlap the opening 120OP defined in the pixel-defining layer 120. That is, the opening 120OP defined in the pixel-defining layer 120 may not be located under the first dummy opening DOP1.

In addition, the pixel-defining layer 120, the intermediate layer 320, and the opposite electrode 330 may be disposed under the dummy layer 567. That is, a pixel electrode 310 may not be disposed under the dummy layer 567. Accordingly, because the pixel electrode 310 is not disposed under the dummy layer 567, light may not be emitted to the second substrate 600 through an area overlapping the dummy layer 567. In this case, the intermediate layer 320 may include a plurality of emission layers.

A first color filter layer 581 may be disposed on the first quantum dot layer 561. In a thickness direction (i.e., a z direction) of the first substrate 100, the first pixel electrode 311 of the first light-emitting element OLED1, the first quantum dot layer 561, and the first color filter layer 581 may overlap each other. The first light-emitting element OLED1 may emit light having the first wavelength band (e.g., about 450 nm to about 495 nm), the first quantum dot layer 561 may convert the light having the first wavelength band (e.g., about 450 nm to about 495 nm) into light having the second wavelength band (e.g., about 630 nm to about 780 nm), and the first color filter layer 581 may selectively transmit the light having the second wavelength band (e.g., about 630 nm to about 780 nm). Light of the first wavelength band (e.g., about 450 nm to about 495 nm) emitted from the first light-emitting element OLED1 may be converted into light having the second wavelength band (e.g., about 630 nm to about 780 nm) through the first quantum dot layer 561 and may be filtered through the first color filter layer 581. Accordingly, light having the second wavelength band (e.g., about 630 nm to about 780 nm) may be emitted from the first pixel PX1. That is, red light may be emitted from the first pixel PX1. Because light emitted from the first light-emitting element OLED1 passes through the first quantum dot layer 561 and the first color filter layer 581, the color purity of light emitted through the second substrate 600 may be improved. Specifically, because light emitted from the first light-emitting element OLED1 but not converted by the first quantum dot layer 561 is filtered by the first color filter layer 581, the color purity of light emitted through the second substrate 600 may be improved. In addition, the first color filter layer 581 may absorb external light to reduce reflection of the external light.

A second color filter layer 583 may be disposed on the second quantum dot layer 563. In the thickness direction (i.e., the z direction) of the first substrate 100, the second pixel electrode 313 of the second light-emitting element OLED2, the second quantum dot layer 563, and the second color filter layer 583 may overlap each other. The second light-emitting element OLED2 may emit light having the first wavelength band (e.g., about 450 nm to about 495 nm), the second quantum dot layer 563 may convert the light having the first wavelength band (e.g., about 450 nm to about 495 nm) into light having the third wavelength band (e.g., about 495 nm to about 570 nm), and the second color filter layer 583 may selectively transmit the light having the third wavelength band (e.g., about 495 nm to about 570 nm). Light of the first wavelength band (e.g., about 450 nm to about 495 nm) emitted from the second light-emitting element OLED2 may be converted into light having the third wavelength band (e.g., about 495 nm to about 570 nm) through the second quantum dot layer 563 and may be filtered through the second color filter layer 583. Accordingly, light having a wavelength belonging to the third wavelength band (e.g., about 495 nm to about 570 nm) may be emitted from the second pixel PX2. That is, green light may be emitted from the second pixel PX2. Because light emitted from the second light-emitting element OLED2 passes through the second quantum dot layer 563 and the second color filter layer 583, the color purity of light emitted through the second substrate 600 may be improved. Specifically, because light emitted from the second light-emitting element OLED2 but not converted by the second quantum dot layer 563 is filtered by the second color filter layer 583, the color purity of light emitted through the second substrate 600 may be improved. In addition, the second color filter layer 583 may absorb external light to reduce the reflection of the external light.

A third color filter layer 585 may be disposed on the light-transmitting layer 565. In the thickness direction (i.e., the z direction) of the first substrate 100, the third pixel electrode 315 of the third light-emitting element OLED3, the light-transmitting layer 565, and the third color filter layer 585 may overlap each other. The third light-emitting element OLED3 may emit light having the first wavelength band (e.g., about 450 nm to about 495 nm), and the light-transmitting layer 565 and the third color filter layer 585 may transmit the light having the first wavelength band (e.g., about 450 nm to about 495 nm). Light of the first wavelength band (e.g., about 450 nm to about 495 nm) emitted from the third light-emitting element OLED3 may pass through the light-transmitting layer 565 and may be filtered through the third color filter layer 585. Accordingly, light having the first wavelength band (e.g., about 450 nm to about 495 nm) may be emitted from the third pixel PX3. That is, blue light may be emitted from the third pixel PX3. Because light emitted from the third light-emitting element OLED3 passes through the light-transmitting layer 565 and the third color filter layer 585, the color purity of light emitted through the second substrate 600 may be improved. In addition, the third color filter layer 585 may absorb external light to reduce the reflection of the external light.

In an embodiment, the first color filter layer 581, the second color filter layer 583, and the third color filter layer 585 may be disposed on the dummy layer 567 to overlap the dummy layer 567 in a plan view. That is, all of the first to third color filter layers 581, 583, and 585 may be disposed on the dummy layer 567. Accordingly, light may not be emitted to the second substrate 600 through the dummy layer 567.

In addition, the pixel-defining layer 120, the intermediate layer 320, and the opposite electrode 330 may be disposed under the second dummy opening DOP2 defined in the bank 500 to overlap the second dummy opening DOP2. That is, the pixel electrode 310 may not be disposed under the second dummy opening DOP2 defined in the bank 500. Accordingly, light may not be emitted to the second substrate 600 overlapping the second dummy opening DOP2 defined in the bank 500. Also, the first color filter layer 581, the second color filter layer 583, and the third color filter layer 585 may be disposed on the second dummy opening DOP2 defined in the bank 500 to overlap the second dummy opening DOP2. That is, all of the first to third color filter layers 581, 583, and 585 may be disposed on the second dummy opening DOP2 defined in the bank 500. Accordingly, light may not be emitted to the second substrate 600 through the second dummy opening DOP2 defined in the bank 500. In this case, the intermediate layer 320 may include a plurality of emission layers.

In an embodiment, at least two color filter layers may overlap each other between the first pixel PX1, the second pixel PX2, and the third pixel PX3. In FIG. 10, an example in which the first color filter layer 581, the second color filter layer 583, and the third color filter layer 585 are disposed between the first pixel PX1, the second pixel PX2, and the third pixel PX3 is shown. As described above, color filter layers overlapping each other may serve as a light blocking layer.

The second substrate 600 may be disposed on the first color filter layer 581, the second color filter layer 583, and the third color filter layer 585. Also, the first color filter layer 581, the second color filter layer 583, and the third color filter layer 585 may be arranged to overlap each other between the second substrate 600 and the bank 500. As the first color filter layer 581, the second color filter layer 583, and the third color filter layer 585 are arranged to overlap each other between the second substrate 600 and the bank 500, a step difference between the second substrate 600 and the bank 500 may be constantly maintained.

In an embodiment, a filler 400 may be disposed between the light-emitting panel 10 and the color panel 20. The filler 400 may be a layer for bonding the light-emitting panel 10 to the color panel 20. In addition, the filler 400 may act as a buffer against external pressure or the like. In an embodiment, the filler 400 may have a refractive index of about 1.5 to about 1.7. For example, the filler 400 may have a refractive index of about 1.5 to about 1.6. Alternatively, the filler 400 may have a refractive index of about 1.6 to about 1.7. When the filler 400 has a refractive index of about 1.5 to about 1.7, the light extraction efficiency of the display apparatus may be improved. In particular, when the filler 400 has a refractive index of about 1.6 to about 1.7, the light extraction efficiency of the display apparatus may be improved.

In an embodiment, a column spacer 450 may be disposed between the first substrate 100 and the second substrate 600. As the column spacer 450 is disposed between the first substrate 100 and the second substrate 600, the distance between the first substrate 100 and the second substrate 600 may be constantly maintained. The column spacer 450 may overlap the bank 500 and the pixel-defining layer 120.

In an embodiment, the column spacer 450 may include the same material as the bank 500. However, the disclosure is not limited thereto. For example, the column spacer 450 may include a material different from that of the bank 500.

According to the embodiments of the disclosure made as described above, a display apparatus having reduced defects in a manufacturing process may be implemented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a first substrate including a display area and a non-display area around the display area;
   a bank disposed on the display area of the first substrate and including first openings, second openings, third openings, first dummy openings, and second dummy openings;
   first quantum dot layers located in the first openings;
   dummy layers located in the first dummy openings; and
   pixel electrodes located between the first substrate and the bank,
   wherein the first dummy openings are separated from the pixel electrodes in a plan view, and each of the first dummy openings and the second dummy openings is disposed in the display area of the first substrate.

2. The display apparatus of claim 1, further comprising second quantum dot layers located in the second openings.

3. The display apparatus of claim 2, wherein the first quantum dot layers convert light having a first wavelength band into light having a second wavelength band and the second quantum dot layers converts light having the first wavelength band into light having a third wavelength band.

4. The display apparatus of claim 2, further comprising light-transmitting layers located in the third openings and allowing incident light to pass through the light-transmitting layers.

5. The display apparatus of claim 4, wherein the dummy layers include a same material as at least one of the first quantum dot layers, the second quantum dot layers, and the light-transmitting layers.

6. The display apparatus of claim 4, further comprising a second substrate located above the first substrate such that the bank is disposed between the first substrate and the second substrate.

7. The display apparatus of claim 6, further comprising:
   first color filter layers located between the first quantum dot layers and the second substrate;
   second color filter layers located between the second quantum dot layers and the second substrate; and
   third color filter layers located between the light-transmitting layers and the second substrate.

8. The display apparatus of claim 7, wherein one of the first color filter layers, one of the second color filter layers, and one of the third color filter layers are located between each of the dummy layers and the second substrate.

9. The display apparatus of claim 1, wherein the dummy layers have hydrophilicity and the bank has hydrophobicity.

10. The display apparatus of claim 1, wherein an area of one of the first dummy openings is greater than an area of one of the second dummy openings.

11. The display apparatus of claim 1, wherein the second dummy openings at least partially surround the first openings, the second openings, the third openings, and the first dummy openings.

12. The display apparatus of claim 1, wherein the pixel electrode includes a first pixel electrode, a second pixel electrode, and a third pixel electrode which are spaced apart from each other on the first substrate.

13. The display apparatus of claim 12, wherein the first pixel electrode at least partially overlaps one of the first openings, the second pixel electrode at least partially overlaps one of the second openings, and the third pixel electrode at least partially overlaps one of the third openings.

14. The display apparatus of claim 12, wherein the first pixel electrode, the second pixel electrode, and the third pixel electrode are separated from the first dummy openings in a plan view.

15. The display apparatus of claim 12, wherein the first pixel electrode, the second pixel electrode, and the third pixel electrode are separated from the second dummy openings in a plan view.

16. The display apparatus of claim 12, further comprising:
   a pixel-defining layer covering an edge of each of the first pixel electrode, the second pixel electrode, and the third pixel electrode, the pixel-defining layer having an opening extending to at least a portion of the first pixel electrode, an opening extending to at least a portion of the second pixel electrode, and an opening extending to at least a portion of the third pixel electrode;

31

32 an emission layer disposed on the first pixel electrode, the second pixel electrode, and the third pixel electrode and emitting light having a first wavelength band; and an opposite electrode disposed on the emission layer.

17. The display apparatus of claim 16, wherein the emission layer and the opposite electrode overlap the first dummy openings.

18. The display apparatus of claim 16, wherein the emission layer and the opposite electrode overlap the second dummy openings.

19. A display apparatus comprising:

a light-emitting panel including a first substrate including a display area and a non-display area around the display area, and light-emitting elements including pixel electrodes and disposed on the first substrate; and a color panel disposed on a second substrate and changing a wavelength of light emitted from the light-emitting panel, wherein the color panel includes:

a bank disposed on the display area of the first substrate and including first openings, second openings, third openings, first dummy openings, and second dummy openings;

first quantum dot layers located in the first openings; and dummy layers located in the first dummy openings, wherein the first dummy openings are separated from the pixel electrodes in a plan view, and each of the first dummy openings and the second dummy openings is disposed in the display area of the first substrate.

20. The display apparatus of claim 19, wherein the color panel further includes second quantum dot layers located in the second openings.

21. The display apparatus of claim 20, wherein the light-emitting panel emits light having a first wavelength band.

22. The display apparatus of claim 21, wherein the first quantum dot layers convert light having the first wavelength band into light having a second wavelength band, and the second quantum dot layers convert light having the first wavelength band into light having a third wavelength band.

23. The display apparatus of claim 21, wherein the color panel further includes light-transmitting layers located in the third openings, and wherein the light-transmitting layers transmit incident light having the first wavelength band.

24. The display apparatus of claim 23, wherein the dummy layers include a same material as at least one of the first quantum dot layers, the second quantum dot layers, and the light-transmitting layers.

25. The display apparatus of claim 23, wherein the color panel further includes:

first color filter layers located between the first quantum dot layers and the second substrate;

second color filter layers located between the second quantum dot layers and the second substrate; and third color filter layers located between the light-transmitting layers and the second substrate.

26. The display apparatus of claim 25, wherein one of the first color filter layers, one of the second color filter layers, and one of the third color filter layers are located between each of the dummy layers and the second substrate.

27. The display apparatus of claim 25, wherein the first color filter layers, the second color filter layers, and the third color filter layers overlap the second dummy openings.

28. The display apparatus of claim 19, wherein the dummy layers have hydrophilicity and the bank has hydrophobicity.

29. The display apparatus of claim 19, wherein the second dummy openings at least partially surround the first openings, the second openings, the third openings, and the first dummy openings.

30. The display apparatus of claim 19, wherein the color panel further includes a column spacer located between the first substrate and the second substrate and overlapping the bank.

* * * * *